(12) United States Patent
Maheshwari

(10) Patent No.: US 9,390,783 B1
(45) Date of Patent: Jul. 12, 2016

(54) MEMORY DEVICES AND SYSTEMS INCLUDING CACHE DEVICES FOR MEMORY MODULES

(71) Applicant: Cypress Semiconductor Corporation, San Jose, CA (US)

(72) Inventor: Dinesh Maheshwari, Fremont, CA (US)

(73) Assignee: CYPRESS SEMICONDUCTOR CORPORATION, San Jose, CA (US)

(*) Notice: Subject to any disclaimer, the term of this patent is extended or adjusted under 35 U.S.C. 154(b) by 0 days.

(21) Appl. No.: 14/066,522

(22) Filed: Oct. 29, 2013

Related U.S. Application Data

(63) Continuation of application No. 12/577,695, filed on Oct. 12, 2009, now Pat. No. 8,572,320.

(60) Provisional application No. 61/167,969, filed on Apr. 9, 2009, provisional application No. 61/167,856, filed on Apr. 8, 2009, provisional application No. 61/158,680, filed on Mar. 9, 2009, provisional application No. 61/147,046, filed on Jan. 23, 2009.

(51) Int. Cl.
*G06F 12/00* (2006.01)
*G06F 13/00* (2006.01)
*G06F 13/28* (2006.01)
*G11C 11/406* (2006.01)
*G11C 11/401* (2006.01)
*G06F 13/16* (2006.01)
*G06F 9/38* (2006.01)

(52) U.S. Cl.
CPC ........ *G11C 11/40615* (2013.01); *G11C 11/401* (2013.01); *G06F 9/3814* (2013.01); *G06F 13/1684* (2013.01)

(58) Field of Classification Search
CPC .............. G06F 13/1684; G06F 9/3814; G11C 11/40615
USPC ................... 711/119, 154; 713/310, 323–324
See application file for complete search history.

(56) References Cited

U.S. PATENT DOCUMENTS

| | | | |
|---|---|---|---|
| 6,530,007 | B2 | 3/2003 | Olarig et al. |
| 7,286,436 | B2 | 10/2007 | Bhakta et al. |
| 7,289,386 | B2 | 10/2007 | Bhakta et al. |
| 7,307,863 | B2 | 12/2007 | Yen et al. |

(Continued)

FOREIGN PATENT DOCUMENTS

| | | |
|---|---|---|
| WO | 2007002324 A | 1/2007 |
| WO | 2007028109 A2 | 3/2007 |
| WO | 2007095080 A2 | 8/2007 |

OTHER PUBLICATIONS

U.S. Appl. No. 12/818,304, "Memory Devices and Systems Including Multi-Speed Access of Memory Modules", filed Jun. 18, 2010; 59 pages.

(Continued)

*Primary Examiner* — Ryan Bertram

(57) ABSTRACT

A memory apparatus may include one or more cache memory integrated circuit (ICs), each of which may have compare circuitry that compares a received address with stored compare values, a cache memory that provides cached data in response to the compare circuitry, a controller interface having at least address and control signal input terminals, and a module output connection having at least address and control signal output terminals corresponding to the address and control signal input terminals.

20 Claims, 23 Drawing Sheets

(56) References Cited

U.S. PATENT DOCUMENTS

| | | | |
|---|---|---|---|
| 7,379,316 | B2 | 5/2008 | Rajan |
| 7,479,799 | B2 | 1/2009 | Raghavan et al. |
| 7,532,537 | B2 | 5/2009 | Solomon et al. |
| 7,571,295 | B2 | 8/2009 | Sakarda et al. |
| 7,721,865 | B2 | 5/2010 | Tominaga et al. |
| 2002/0002662 | A1 | 1/2002 | Olarig et al. |
| 2003/0061458 | A1 | 3/2003 | Wilcox et al. |
| 2004/0064648 | A1 | 4/2004 | Brown et al. |
| 2004/0073749 | A1 | 4/2004 | Parthasarathy et al. |
| 2005/0146973 | A1 | 7/2005 | Schoenfeld |
| 2006/0015772 | A1 | 1/2006 | Ang et al. |
| 2006/0129741 | A1 | 6/2006 | Hillier et al. |
| 2007/0033367 | A1 | 2/2007 | Sakarda et al. |
| 2007/0058410 | A1* | 3/2007 | Rajan .............................. 365/63 |
| 2007/0204075 | A1 | 8/2007 | Rajan et al. |
| 2007/0260818 | A1 | 11/2007 | Damaraju et al. |
| 2008/0010435 | A1 | 1/2008 | Smith et al. |
| 2008/0028135 | A1 | 1/2008 | Rajan et al. |
| 2008/0028137 | A1 | 1/2008 | Schakel et al. |
| 2008/0077732 | A1 | 3/2008 | Risse |
| 2008/0082750 | A1 | 4/2008 | Okin et al. |
| 2008/0082753 | A1 | 4/2008 | Licht et al. |
| 2008/0103753 | A1 | 5/2008 | Rajan et al. |
| 2008/0104314 | A1 | 5/2008 | Rajan et al. |
| 2008/0109206 | A1 | 5/2008 | Rajan et al. |
| 2008/0109595 | A1 | 5/2008 | Rajan et al. |
| 2008/0109597 | A1 | 5/2008 | Schakel et al. |
| 2008/0109598 | A1 | 5/2008 | Schakel et al. |
| 2008/0115006 | A1 | 5/2008 | Smith et al. |
| 2008/0120443 | A1 | 5/2008 | Rajan et al. |
| 2008/0126624 | A1* | 5/2008 | Prete et al. ...................... 710/53 |
| 2008/0126687 | A1 | 5/2008 | Rajan et al. |
| 2008/0126688 | A1 | 5/2008 | Rajan et al. |
| 2008/0126689 | A1 | 5/2008 | Rajan et al. |
| 2008/0126692 | A1 | 5/2008 | Rajan et al. |
| 2008/0133825 | A1 | 6/2008 | Rajan et al. |
| 2008/0170425 | A1 | 7/2008 | Rajan |
| 2009/0006756 | A1 | 1/2009 | Donley |
| 2009/0024789 | A1 | 1/2009 | Rajan et al. |
| 2009/0024790 | A1 | 1/2009 | Rajan et al. |
| 2009/0103345 | A1 | 4/2009 | McLaren et al. |
| 2010/0023674 | A1* | 1/2010 | Aviles ........................... 711/103 |
| 2010/0077240 | A1* | 3/2010 | Daga et al. .................... 713/320 |
| 2010/0095048 | A1* | 4/2010 | Bechtolsheim et al. ...... 711/103 |
| 2010/0106904 | A1* | 4/2010 | Berke et al. ................... 711/114 |

OTHER PUBLICATIONS

U.S. Appl. No. 61/158,680 "Pre-Fetch Cache DIMM Accelerator", filed Mar. 9, 2009; 7 pages.

U.S. Appl. No. 61/218,286, "Cached DIMM System and Method", filed Jun. 18, 2009; 52 pages.

Ganesh et al., "Fully-Buffered DIMM Memory Architectures: Understanding Mechanisms, Overheads and Scaling," IEEE 13th International Symposium on High-Performance Computer Architecture (HPCA 2007), Feb. 13, 2007, Phoeniz, Arizona.

Intel, An Overview of Cache, Feb. 11, 2007, Available at: http://web.archive.org/web/20070211091515/http://download.intel.com/design/intarch/papers/cache6.pdf.

International Search Report for International Application No. PCT/US10/39262 dated Nov. 17, 2010; 2 pages.

USPTO Advisory Action for U.S. Appl. No. 12/577,695 dated Jul. 30, 2012; 3 pages.

USPTO Final Rejection for U.S. Appl. No. 12/577,695 dated May 16, 2012; 20 pages.

USPTO Non Final Rejection for U.S. Appl. No. 12/577,695 dated Jan. 27, 2012; 15 pages.

USPTO Non-Final Rejection for U.S. Appl. No. 12/577,695 dated Aug. 27, 2012; 18 pages.

USPTO Non-Final Rejection for U.S. Appl. No. 12/818,304 dated Oct. 3, 2012; 26 pages.

USPTO Notice of Allowance for U.S. Appl. No. 12/577,695 dated Jan. 3, 2013; 11 pages.

USPTO Notice of Allowance for U.S. Appl. No. 12/577,695 dated Mar. 12, 2013; 10 pages.

USPTO Notice of Allowance for U.S. Appl. No. 12/577,695 dated Aug. 30, 2013; 11 pages.

USPTO Notice of Allowance for U.S. Appl. No. 12/818,304 dated Feb. 28, 2013; 8 pages.

USPTO Requirement for Restriction for U.S. Appl. No. 12/818,304 dated Jan. 25, 2013; 7 pages.

Written Opinion of the International Searching Authority for International Application No. PCT/US10/39262 mailed Nov. 17, 2010 ; 6 pages.

Bruce Jacob, U. Maryland, "Appraisal of Cypress Semiconductor's Cached LR-DIMM Proposal. "http://www.ece.umd.edu/blj dated May 21, 2009; 12 pages.

USPTO Non-Final Rejection for U.S. Appl. No. 14/275,491 dated Nov. 6, 2015; 8 pages.

USPTO Final Rejection for U.S. Appl. No. 14/275,491 dated Mar. 28, 2016; 9 pages.

* cited by examiner

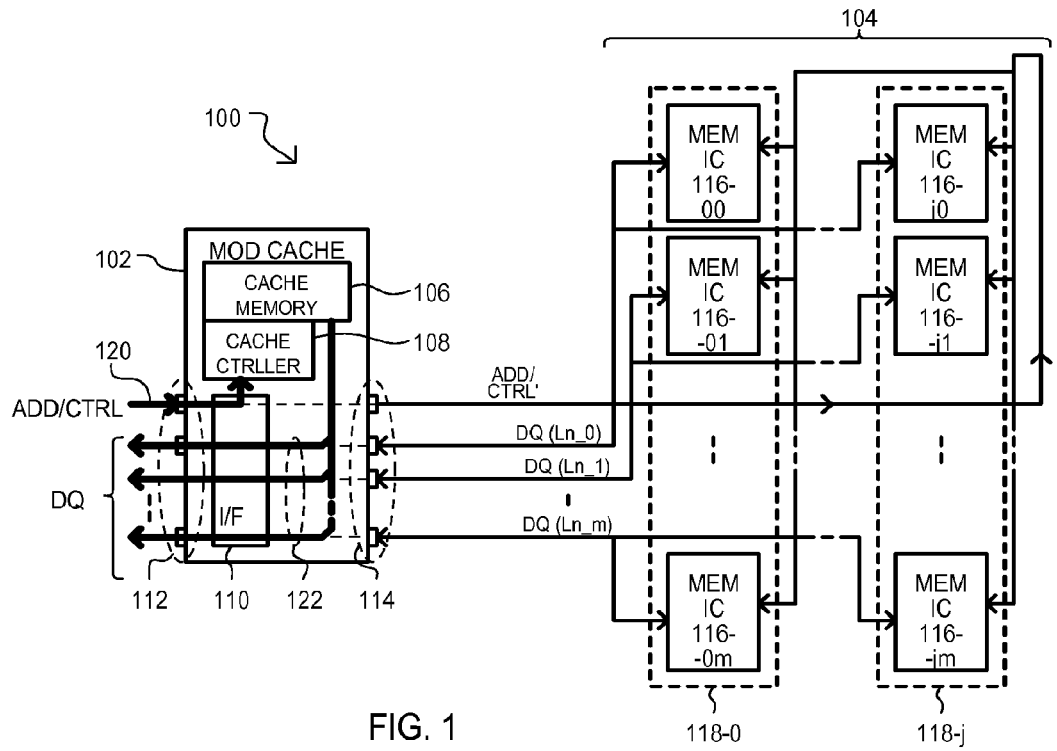
FIG. 1
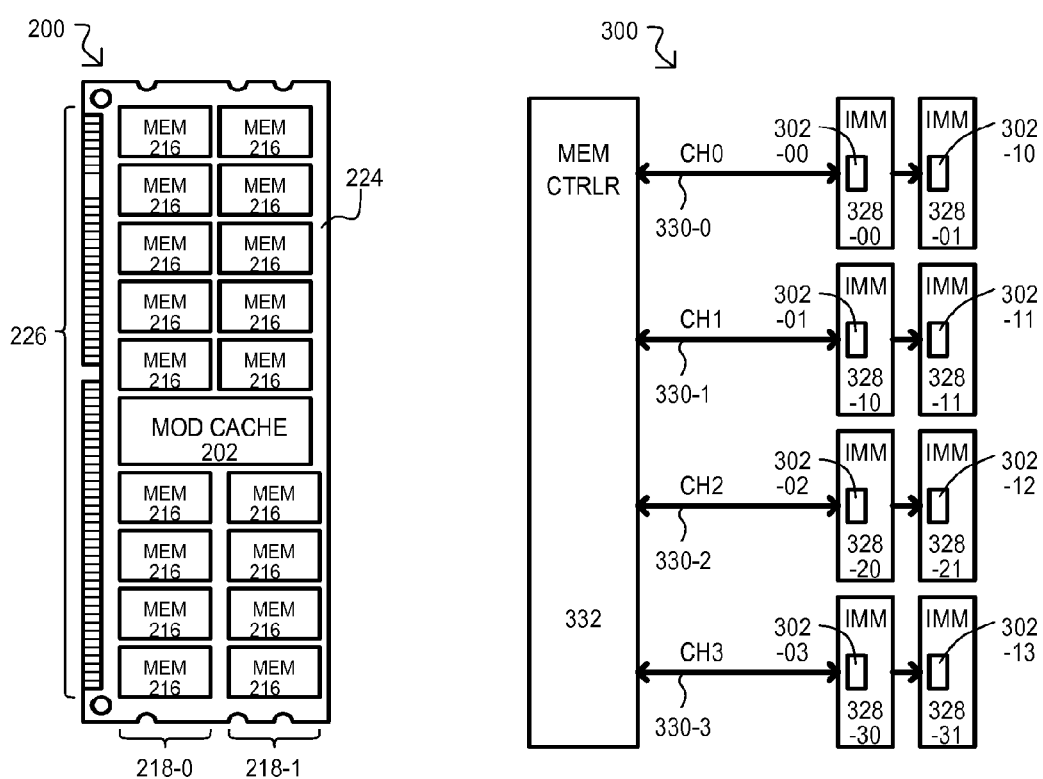
FIG. 2
FIG. 3

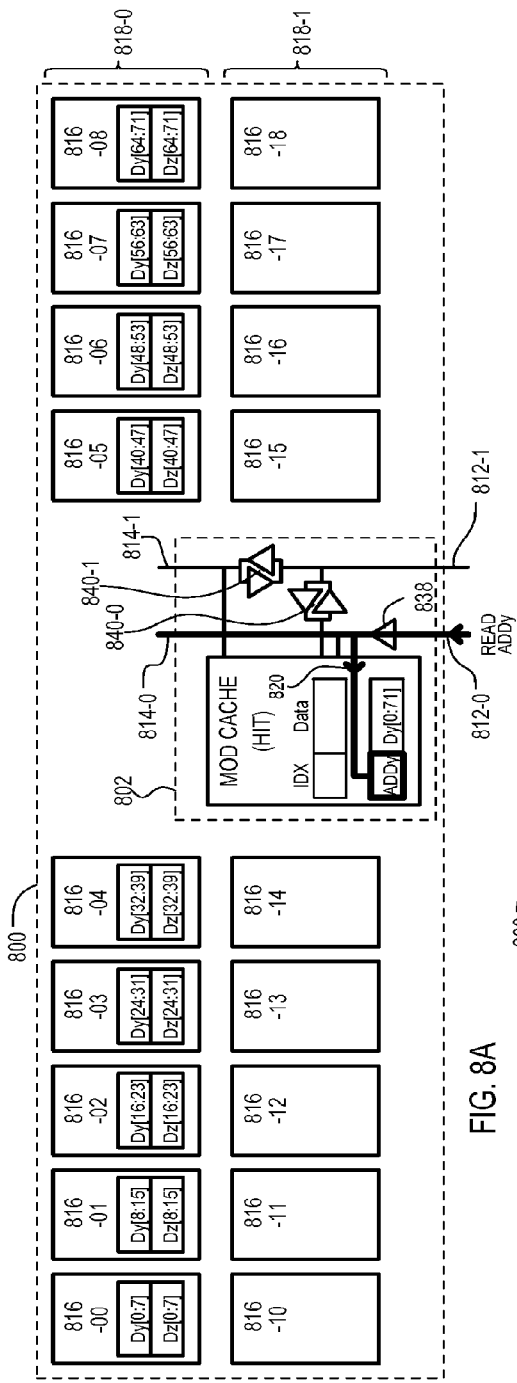
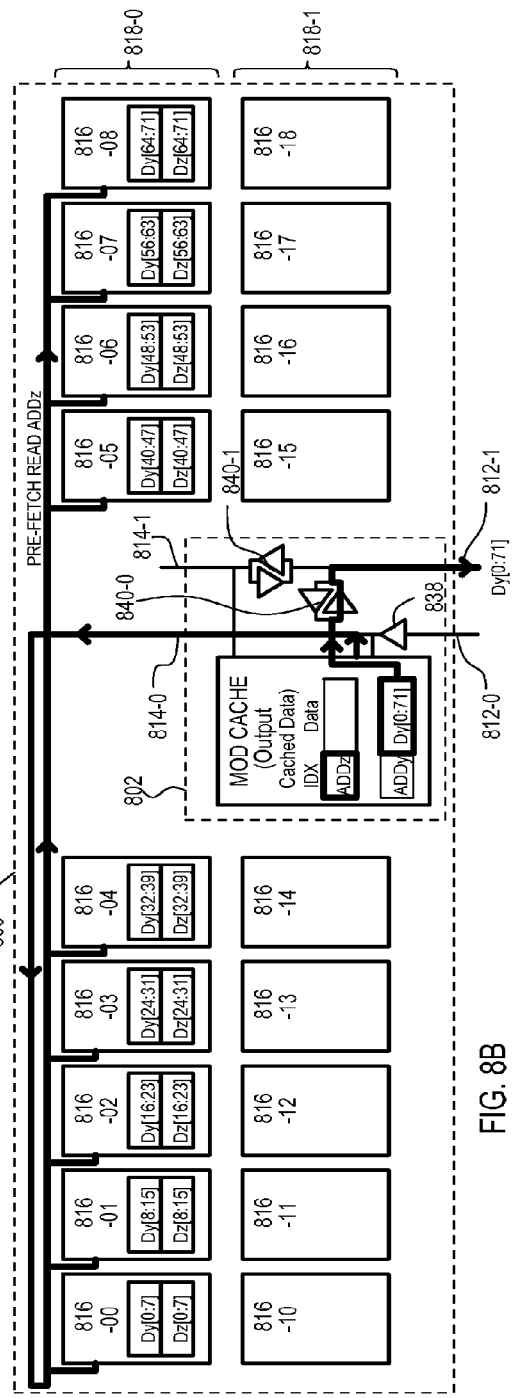
FIG. 8A
FIG. 8B

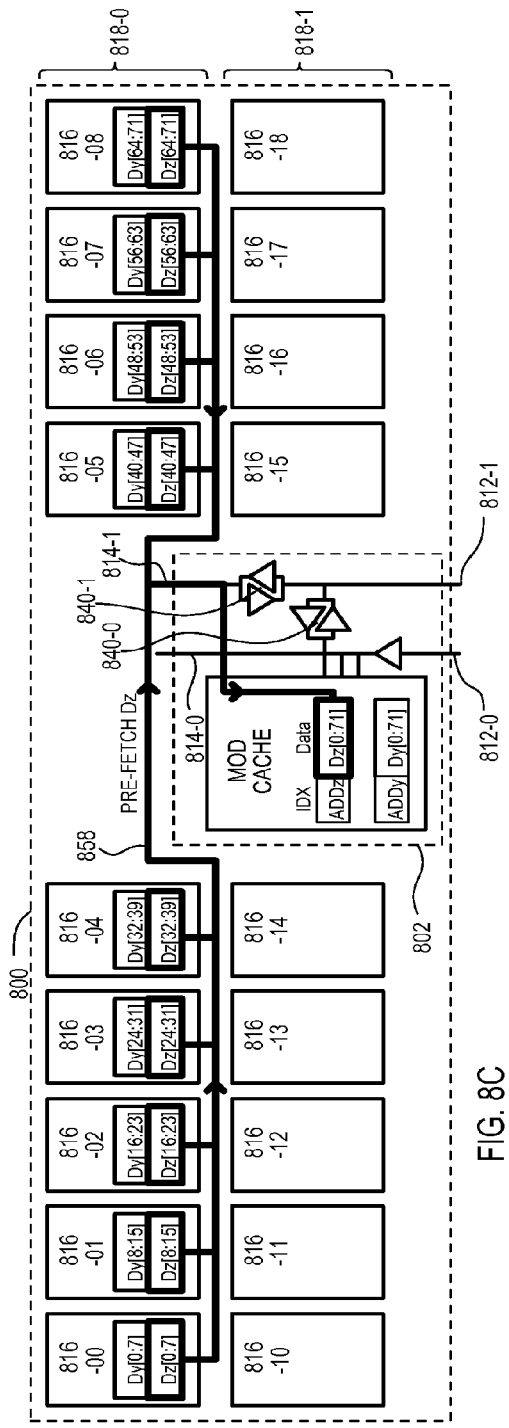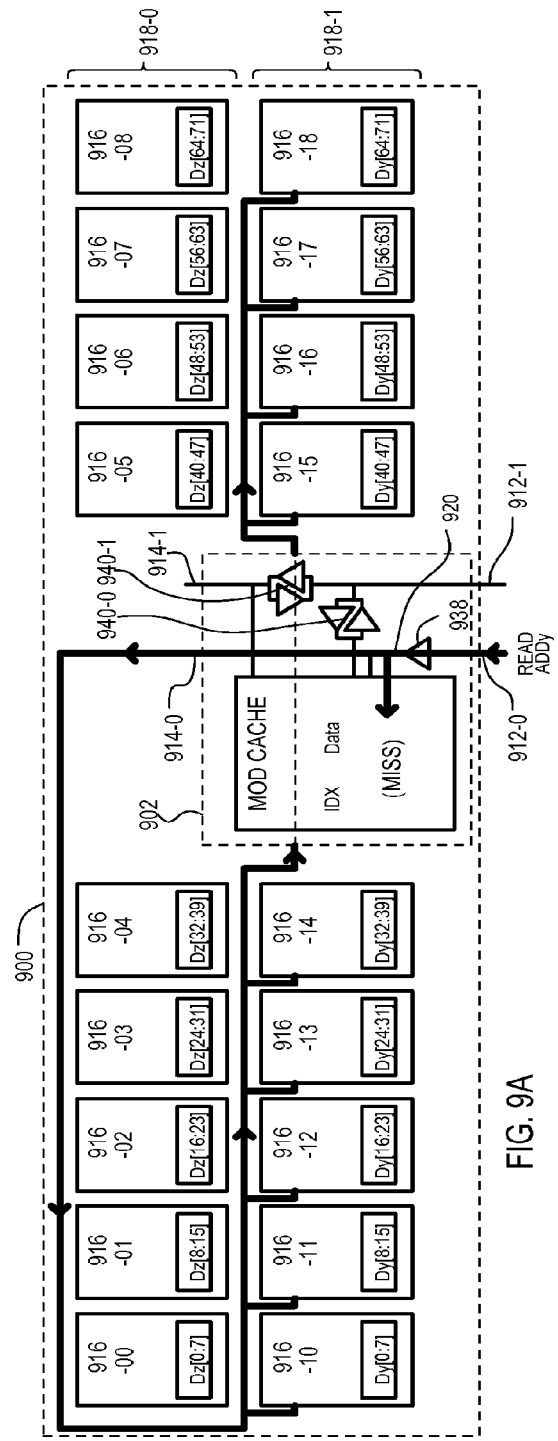

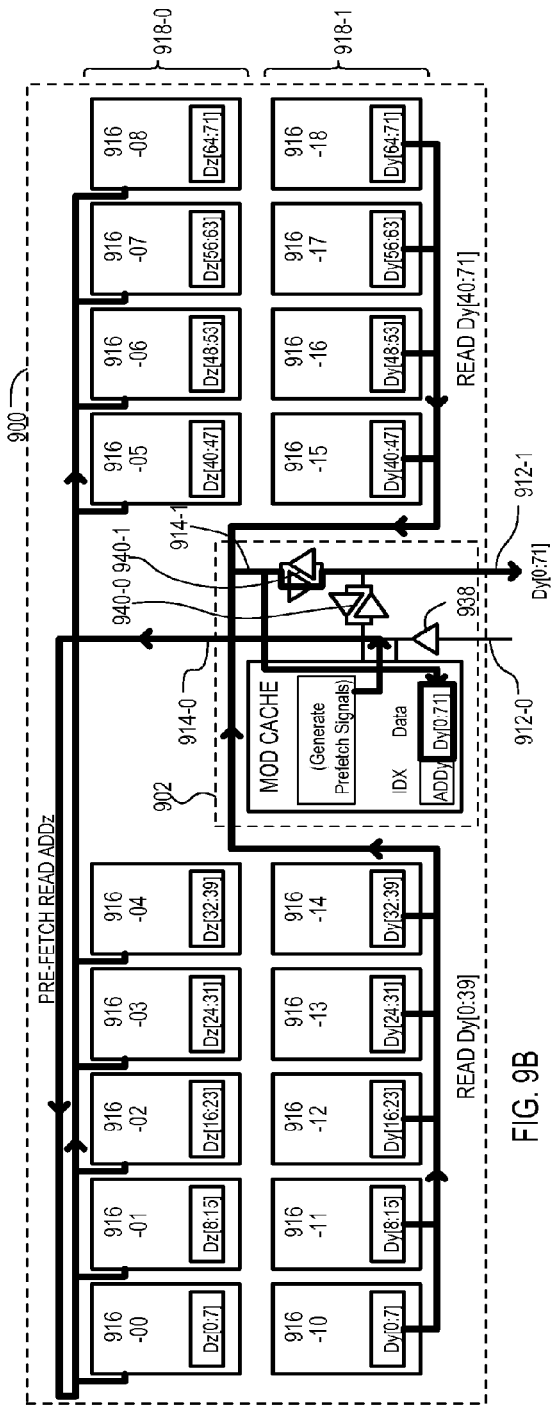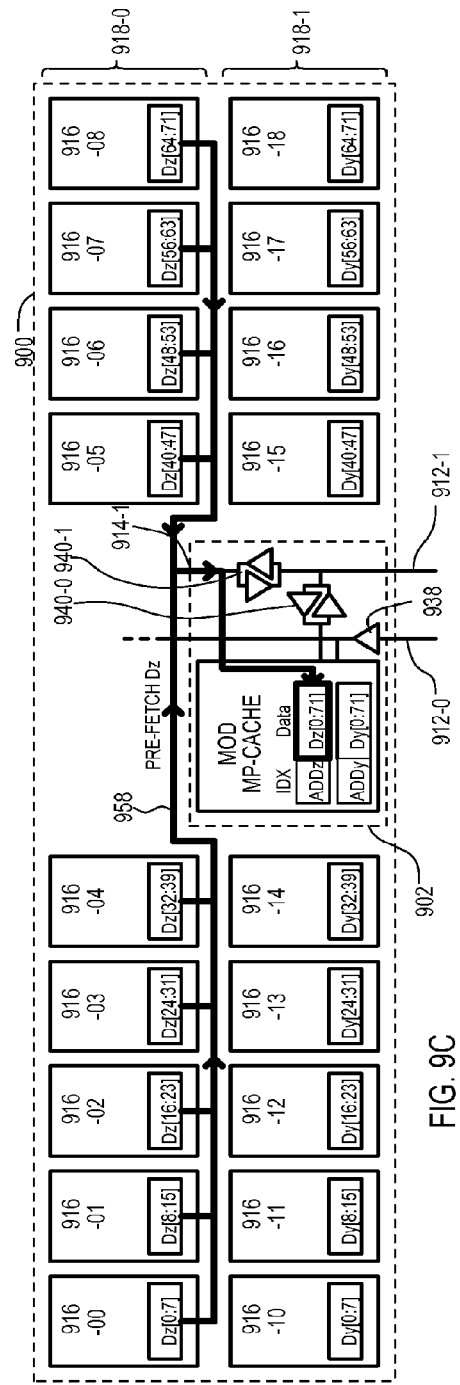

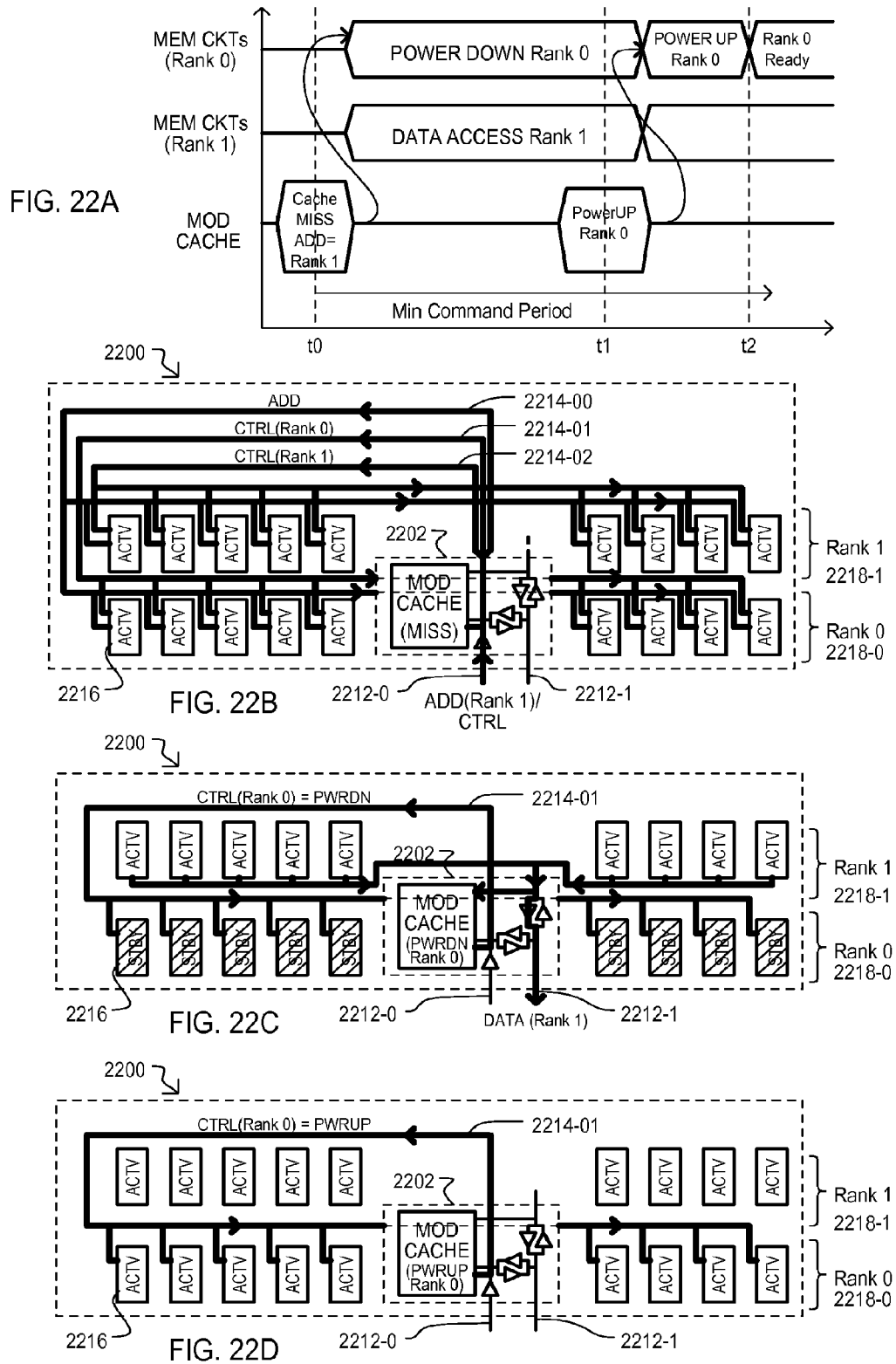

MEMORY DEVICES AND SYSTEMS INCLUDING CACHE DEVICES FOR MEMORY MODULES

This application is a continuation of U.S. patent application Ser. No. 12/577,695, filed Oct. 12, 2009, now U.S. Pat. No. 8,572,320, issued Oct. 29, 2013, which claims the benefit of U.S. Provisional Patent Application No. 61/147,046, filed Jan. 23, 2009, U.S. Provisional Patent Application No. 61/158,680, filed Mar. 9, 2009, U.S. Provisional Patent Application No. 61/167,856, filed Apr. 8, 2009, and U.S. Provisional Patent Application No. 61/167,969, filed Apr. 9, 2009. All of which are incorporated by reference herein in their entirety.

TECHNICAL FIELD

The present disclosure relates generally to integrated circuits (ICs), and more particularly to a cache memory IC that may be included in a memory module containing multiple memory ICs.

BRIEF DESCRIPTION OF THE DRAWINGS

FIG. 1 is a block schematic diagram of a memory device according to a first embodiment.

FIG. 2 is a plan view of an in-line memory module device according to another embodiment.

FIG. 3 is a block schematic diagram of a system memory device according to a further embodiment.

FIGS. 8A to 8C are block schematic diagrams of a memory device and corresponding data pre-fetch on hit operation according to embodiments.

FIGS. 9A to 9C are block schematic diagrams of a memory device and corresponding data pre-fetch on miss operation according to embodiments.

FIGS. 22A to 22D show a timing diagram and block schematic diagrams of a memory device and power down operation according to another embodiment.

DETAILED DESCRIPTION

Figure 4:
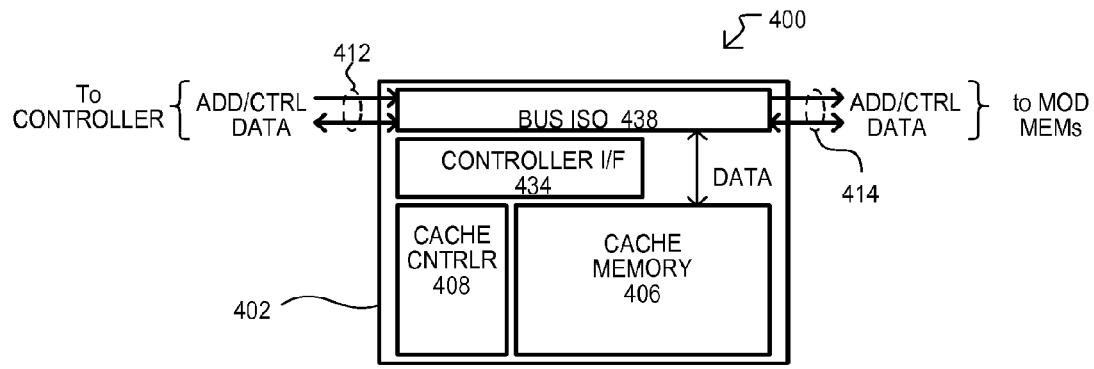
FIG. 4 is a block schematic diagram of module cache device according to an embodiment.

Various embodiments will now be described that show circuits, integrated circuit devices (ICs), modules containing ICs, and systems including modules, as well as corresponding methods related to the operations of such circuits, devices and systems.

Referring to FIG. 1, a memory device according to one embodiment is shown in a block diagram and designated by the general reference character 100. A memory device 100 may include a module cache device 102, and optionally, a module memory section 104.

A module cache device 102 may include a cache memory 106, a cache controller circuit 108, a controller interface 110, controller connections 112, and memory control connections 114. A cache memory 106 may include storage circuits for caching data from other memory devices. Thus, a cache memory 106 may be accessed in place of an access to other memory locations, such as devices within a module memory section 104, for example.

A cache controller circuit 108 may detect cache "hits", and in response, control access to cache memory 106. A cache hit may occur when access is requested for data stored in cache memory 106 that was previously retrieved from another memory location (e.g., memory module section 104). As but one example, if a read operation results in a cache hit, a cache controller circuit 108 may output appropriate data cached within cache memory 106. As another example, in some embodiments, if a write operation results in a cache hit, a cache controller circuit 108 may enable write data to be written into cache memory 106. Further, a cache controller circuit 108 may then allow such cached write data to be written to other memory locations, such as module memory section 104. In other embodiments, write data may be "written through" a module cache device 102 (e.g., directly to memory module section 104) and never stored within cache memory 106.

A cache memory 106 may be based on any suitable memory technology, including volatile as well as nonvolatile memory technologies. In very particular embodiments a volatile memory technology may provide rapid access to cached data. In other embodiments, a nonvolatile memory technology may consume less power than a volatile memory technology.

A controller interface (I/F) 110 may receive address and command signals received on controller connections 112 (some shown as ADD/CTRL) and provide such values for cache controller circuit 108. In the particular embodiment shown, a controller I/F 110 may also receive externally generated input data values, and output data values on controller connections (shown as data input/output connections (DQ)). It is understood that in other embodiments, data connections may unidirectional (e.g., include data output connections for outputting data from module cache device 102 and/or include data input connections for receiving data from external sources).

Memory control connections 114 may provide signals for accessing memory locations separate from those within module cache device 102, such as locations within module memory section 104, for example. In the embodiment shown, memory control connections 114 may correspond to controller connections 112. That is, for each signal received and/or output at signal controller connection 112 there may be a corresponding signal output and/or received at memory control connections 114. In such an embodiment, a signal set received by module cache device 102 may be the same as those used to control memory circuits 116-00 to **116-*jm* of module memory section 104**.

In the very particular embodiment of FIG. 1, memory control connections 114 include output connections for address and control signals ADD/CTRL', which may correspond to input signals ADD/CTRL at controller connections 112. In addition, memory control connections 114 may include data I/O lanes DQ (Ln_0) to DQ (Ln_m) corresponding to data I/Os DQ at controller connections 112.

In one very particular embodiment, a module cache device 102 may be an IC, and memory control connections 114 and controller connections 112 may be physical signal connections for an IC, including but not limited to: pins, pads, bumps, or balls.

A module memory section 104 may include a number of memory circuits 116-00 to **116-*jm* that store data for caching by module cache device 102. In one embodiment, memory circuits (116-00 to 116-*jm*) may be logically arranged into ranks (118-0 to 118-*j*). Ranks (118-0 to 118-*j*) may receive and provide data in parallel to module memory section 104. In a specific embodiment, memory circuits (116-00 to 116-*jm*) of ranks (118-0 to 118-*j*) may be physically mounted in rows on a same circuit board along with module cache device 102**.

In other embodiments, a memory circuits (116-00 to **116-*jm*) may be included in a same integrated circuit package as a module cache device 102**. As but one limited examples, such an integrated circuit package may include a "multi-chip module".

Referring still to FIG. 1, a cache hit read operation according to an embodiment is shown. Address and control signals (shown by bold line 120) may be received. It is assumed that an address corresponds to data already cached within cache memory 106 resulting in a cache "hit". That is, while data to be read is stored in a rank (118-0 to **118-*j*), the same data has been previously cached for storage in cache memory 106. In response to the cache hit, cached data values (shown by bold lines 122) may be output on controller connections 112, in lieu of outputting data from a rank (118-0 to 118-*j*). Data locations may be accessed from a cache memory 106 at substantially faster speeds than locations within module memory sections 104**.

In this way, a memory device may include a module cache device between a memory controller and multiple memory devices.

In some embodiments, a module cache device may include an interface with a controller that may operate at a faster data access rate than a speed at which memory devices are accessed. Accordingly, a memory controller may access a module cache memory device on a higher bandwidth communication path than that utilized by module cache device to access memory device.

Referring to FIG. 2, a memory device 200 according to another embodiment is shown in a plan view. In one particular embodiment, a memory device 200 may be one implementation of the embodiment shown in FIG. 1. A memory device 200 may include a module cache device 202, in integrated circuit form, mounted on a circuit board 224. Each of memory circuits 216 may also be in integrated circuit form, and mounted on the circuit board 224 in ranks 218-0 and 218-1, in an in-line fashion. A circuit board 224 may further include board connections 226 formed on at least one side of circuit board 224. In an embodiment like that of FIG. 2, a memory device 200 may be an in-line memory module (IMM), such as a single IMM (SIMM), or a dual IMM (DIMM) in the event connections and memory circuits are formed on both sides of circuit board.

It is understood that at least a portion of, or in some embodiments all, of signals received at board connections 226 may be received by module cache device 202. Such signals may be allowed to pass through to memory circuits 216 (e.g., a look-aside architecture), or alternatively, may result in cache device 202 generating signals for memory circuits 216 (e.g., a look-through architecture).

In this way, a memory device may be an in-line module having multiple memory circuit ICs and a module cache device IC mounted on a same circuit board.

Referring to FIG. 3, a memory device 300 according to another embodiment is shown in a block schematic diagram. In one particular embodiment, a memory device 300 may be one implementation of embodiments shown in FIGS. 1 and/or 2. A memory device 300 may include a number of in-line memory modules (IMMs) 328-00 to 328-31 and a memory controller 332. Each IMM (328-00 to 328-31) may include a module cache device 302-00 to 302-31, according to the embodiments shown herein, or equivalents. Multiple IMMs (328-00 to 328-31) may be commonly connected to different channel buses 330-0 to 330-3. Data locations within IMMs (328-00 to 328-31) may be accessed on channel buses (330-0 to 330-3) by a memory controller 332.

A memory controller 332 may generate control and address values for transmission on channel buses (330-0 to 330-3) to access storage locations within IMMs (328-00 to 328-31). A memory controller 332 may also receive read data and/or output write data on channel buses (330-0 to 330-3). In the event a data location is a cached location, an access may be faster than an arrangement that does not include a module cache devices (302-00 to 302-31). A memory controller 332 may be one or more separate ICs, or may be a portion of a larger IC package, such as those that include one or more microprocessors.

In this way, a memory device may include a memory controller that accesses multiple IMMs on multiple data buses, where each such IMM includes one or more module cache device.

Referring to FIG. 4, a memory device 400 according to another embodiment is shown in a block schematic diagram. A memory device 400 may include a module cache device 402. A module cache device 402 may include a cache memory 406, a cache controller 408, a cache controller interface (I/F) 434, and a bus isolation circuit 438. A cache memory 406 may have storage locations that cache data for other memory locations. A cache memory 406 may be controlled by a cache controller 408 to store data and/or output data. A cache controller 408 may receive control signals from a cache controller I/F 434, and in response, enable access to cache memory 406. Such accesses may have a predetermined timing relationship with respect to received control signals. For example, in response to a control signals, data may be output or written into cache memory a predetermined time period (e.g., clock cycles) afterward.

A bus isolation circuit 438 may control how signals are transmitted between controller connections 412, memory control connections 414, and other circuits within module cache device 402 (e.g., cache memory 406, cache controller 408). In a particular embodiment, a bus isolation circuit 438 may receive control signals and input data signals without including the load of memory devices attached to memory control connections 414. For non-cache accesses, input signals received on controller connections 412 may be repeated on memory control connections 414, and similarly, output signals on memory control connections 414 may be output on controller connections 412.

In this way, a module memory device may include a bus isolation circuit for selectively isolating signals received from a memory controller from signals output to control memory circuits.

Figure 5:
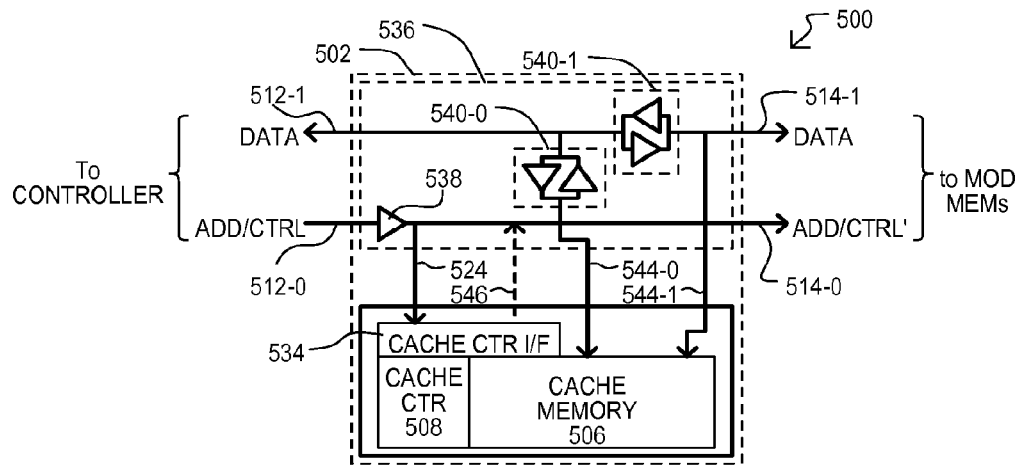
FIG. 5 is a block schematic diagram of module cache device having a look aside architecture according to an embodiment.

Referring to FIG. 5, a memory device 500 according to a further embodiment is shown in a block schematic diagram. A memory device 500 may include a module cache device 502. A module cache device 502 may include sections like those of FIG. 4, accordingly, like sections are referred to by the same reference character but with the first digit being a "5" instead of "4". In the particular embodiment of FIG. 5, a bus isolation circuit 536 may include uni-directional isolation buffer circuits 538, as well as bi-directional isolation buffer circuits 540-0 and 540-1.

Uni-directional isolation buffer circuit 538 may have an input connected to receive input address and control signals (ADD/CTRL) on controller connections 512-0 and an output connected to cache controller inputs 542 and to memory control connections 514-0, which may provide output address and control signals ADD/CTRL'. A uni-directional isolation buffer circuit 538 may function as a buffer, re-generating input address and control signals (ADD/CTRL) to generate corresponding output signals ADD/CTRL' for controlling other memory circuits, and as inputs to cache controller 508.

A first bi-directional isolation buffer circuit 540-0 may buffer signals in both directions between controller connections 512-1 and a first cache data I/O 544-0 and electrically isolate such connections. In such an arrangement, data values may be output on controller connections 512-1 from cache memory 506, or in some embodiments, also input to cache memory 506 from controller connections 512-1. A second bi-directional isolation buffer circuit 540-1 may buffer signals into both directions between controller connections 512-1 and memory control connections 514-1 as well as second cache data I/O 544-1. In such an arrangement, data values may be output on controller connections 512-1 from other (e.g., module memory circuits) memory circuits, or input to cache memory 506 from such other memory circuits.

Each of first and second bi-directional isolation buffer circuits (540-0 and 540-1) may also create a high impedance path between their corresponding connections (i.e., provide an isolation function). It is understood that isolation buffer circuit 538 and 540-0 and 540-1 may be controlled by signals generated from cache controller 508. In addition, in particular embodiments, any or all of isolation buffer circuits (538 and 540-0 and 540-1) may include programmable impedance matching circuits to provide impedance matching with respect to signal transmission lines connected to controller connections 512 and/or memory control connections 514.

Optionally, a module memory section 504 may include cache control output 546 that may provide control and in particular embodiments, address values on memory control connections 514-0. A cache controller 508 may generate signals on cache control output 546 that enable operations on memory circuits independent of those indicated by signals received on controller connections 512. Such self-generated signals from a module cache device 502 may allow for particular operations, including data pre-fetch, selective power down, and selective activation. Such operations will be described in more detail in conjunction with other embodiments below.

In this way, a module cache memory device may include isolation buffer circuits that provide signal paths through the cache memory device and to circuits within the cache memory device.

Figure 6:
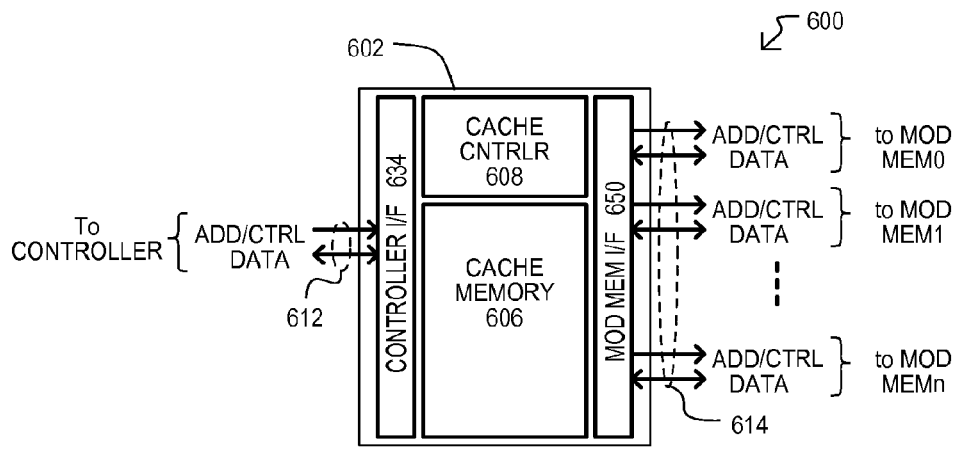
FIG. 6 is a block schematic diagram of a module cache device having a look through architecture according to an embodiment.

Referring to FIG. 6, a memory device 600 according to another embodiment is shown. A memory device 600 may include a module cache device 602. A module cache device 602 may include a cache memory 606, a cache controller 608, a cache controller I/F 634, and a module memory I/F 650. Module cache device 602 of FIG. 6 may show one embodiment having a look-through architecture. In such a look-through architecture, signals received on controller connections 612 may be decoded, and new control signals and/or data signals may be generated at module memory I/F 650. In the very particular embodiment of FIG. 6, a module memory I/F 650 may accommodate multiple sets of address/control and data values. In some embodiments, a cache controller I/F 634 may be serial interface.

In this way, a module cache memory device may have a look-through architecture.

Figure 7:
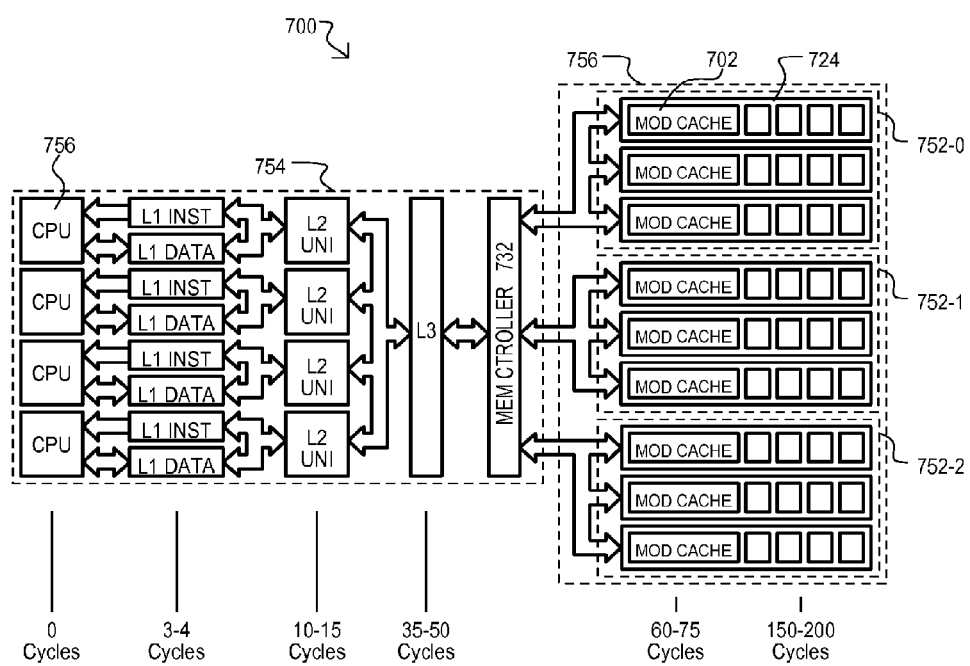
FIG. 7 is a block schematic diagram of a memory device having a system memory of memory modules according to an embodiment.

Referring to FIG. 7, a memory device is shown in a block schematic diagram and designated by the general reference character 700. A memory device 700 may be a computing system that includes a number of circuit board groups 752-0 to 752-2, each connected to a processing package 754. Each circuit board group 752-0 to 752-2 may include a number of circuit boards (one shown as 724). Each circuit board (e.g., 724) may include multiple memory circuits (one shown as 716) as well as one or more module cache devices (one shown as 702). A circuit board (e.g., 724) and/or module cache device (e.g., 702) may take the form of embodiments shown herein, or equivalents. In one particular embodiment, circuit boards (e.g., 724) may be IMMs, module cache devices (e.g., 702) and memory circuits 716 may be separate ICs mounted on such IMMs.

Circuit board groups 752-0 to 752-2 may collectively form a system memory 756. Such a system memory 756 may be increased in capacity by adding more circuit boards (e.g., 724) or decreased by removing circuit boards (e.g., 724).

A processing package 754 may access memory on circuit boards (e.g., 724) with read and/or write operations. In response to such operations, module cache devices (e.g., 702) may monitor such requests, and in the event of a cache hit, may services such requests at a faster rate than accesses to memory circuits (e.g., 716). The very particular processing package 754 of FIG. 7 may be a multi-processor system including multiple central processing units (CPUs) (one shown as 756), and three layers of "on-board" cache (shown as L1, L2 and L3). An on-board cache may be formed in a same substrate as an integrated circuit including a CPU and/or may be a memory integrated circuit included within a multi-chip module containing one or more CPUs.

Layer 1 cache (L1) may include both instruction and data caches, accessible by a corresponding CPU. Layer 2 cache (L2) may be a data cache also accessible by a corresponding CPU. Layer 3 (L3) cache may be a shared data cache accessible by any of the CPUs. It is noted that on-board caches L1, L2 and L3 do not scale with changes in the size of system memory 756. In sharp contrast, an overall amount of cache memory provided by module cache devices 702 does scale with system memory size 756 provided added circuit boards including one or more module cache devices (e.g., 702) as described herein, or equivalents.

Referring still to FIG. 7, exemplary access speeds, noted in CPU clock cycle time units are shown. Accesses to layer 1 cache (L1) may occur within 3-4 clock cycles. Access to layer 2 cache (L2) may occur within 10-15 clock cycles. Accesses to shared layer 3 cache (L3) may occur in 35-50 clock cycles. Absent the presence of module cache devices (e.g., 702), accesses to memory circuits (e.g., 716) may take from 150-200 clock cycles. However, with the inclusion of module cache devices (e.g., 702), in the event of a cache hit, access times that would otherwise take 150-200 clock cycles may be reduced to 60-75 clock cycles.

In this way, a memory device may provide cache memory that scales with the size of a system memory, and may reduce access times when data is cached in module cache devices.

Referring now to FIGS. 8A to 8C, a memory device and operations will now be described in a series of block diagrams. FIGS. 8A to 8C show one example of a "pre-fetch within rank on hit" type of operation. In such an operation, in the event of a read cache hit (e.g., read operation to data already cached in a module cache device), cached read data may be output, and in addition, data from a different location is cached (i.e., is "pre-fetched"). Pre-fetching data in this fashion may increase the probability of another cache hit in a subsequent memory access. A memory device 800 may include a module cache device 802 and a number of memory circuits 816-00 to 816-18. In the particular embodiments of FIGS. 8A to 8C, a module cache device 802 may include sections like those shown in FIG. 5, accordingly, like sections are referred to with the same reference character but with the first digit being a "8" instead of a "5". However, it is understood that alternate pre-fetch embodiments may include a module cache device having a different look aside architecture, or alternatively, having a look through architecture.

Memory circuits 816-00 to 816-18 may be divided into ranks from which data may be accessed in a given operation. The embodiments of FIGS. 8A to 8C show two ranks, a first rank 818-0 may include memory circuits 816-00 to 816-08, while a second rank 818-1 may include memory circuits 816-10 to 816-18. Other embodiments may include fewer circuits per rank, or fewer or greater numbers of ranks. In one very particular embodiment, module cache device 802 and each of memory circuits 816-00 to 816-18 may be separate integrated circuits mounted on a same circuit board. More particularly, module cache device 802 and memory circuits 816-00 to 816-18 may form an IMM.

Referring still to FIGS. 8A to 8C, in the embodiments shown it is assumed that rank 818-0 stores first data "Dy" and second data "Dz" at separate addressable locations. Further, such data values are 72-bit wide data values, with each memory circuit of rank 818-0 providing 8-bits of such a data value. It is also assumed that data values Dy and Dz have a predetermined relationship conducive to pre-fetching. That is, if data Dy is accessed, it is likely that data Dz will be accessed. In some embodiments, such a relationship may be simply an adjacent address, but in other embodiments, may be more complex. It is also assumed that data Dy has been cached within module memory device 802 by a previous operation.

Referring now to FIG. 8A, a memory device 800 may receive address and control values (shown by a bold line) that indicate a read request for data Dy at address ADDy (READ ADDy). Isolation buffer 838 may forward such a request for processing by circuits of module cache device 802. Optionally, such data may be forwarded to memory circuits (816-10 to 816-18). In such a case, resulting read data from memory circuits (816-10 to 816-18) may be prevented from being output by placing isolation circuit 840-1 into a high impedance state, or by disabling memory circuits (816-10 to 816-18) with control signals (e.g., clock enable signals (CKE)) generated by module cache device 802. Module memory device 802 may compare the received address to cached addresses. Because data value Dy is already stored, module memory device 802 may detect a read cache hit.

Referring to FIG. 8B, in response to the read cache hit, module memory device 802 may enable isolation buffer 840-0 and output cached data 822 (Dy[0:71]) on controller connections 812-1. In addition, module memory device 802 may generate a pre-fetch address and corresponding read control signals for pre-fetch data Dz (PRE-FETCH READ ADDz). Such address and control signals may be output on memory control connections 814-0 and provided to the memory circuits 816-00 to 816-08 of rank 818-0 (and optionally to the memory circuits of rank 818-1).

Referring to FIG. 8C, in response to the pre-fetch address and control signals (PRE-FETCH READ ADDz), memory circuits 816-00 to 816-08 of rank 818-0 may output pre-fetched data 858 (PRE-FETCH DATAz) which may be received by module cache device 802 on memory control connections 814-1 and stored as newly cached data. In the particular embodiment shown, module cache device 802 may place isolation buffer circuits 840-0 and 840-1 into high impedance states as such cached data is stored.

In this way, a memory device may pre-fetch stored data in response to a cache hit to increase the possibility of another cache hit in a subsequent operation.

Referring now to FIGS. 9A to 9C, memory device and methods according other embodiments will now be described in a series of block diagrams. FIGS. 9A to 9C show examples of "pre-fetch between ranks on miss" types of operations. In such operations, in the event of a read cache miss (e.g., read operation to data not already cached in a module cache device), data corresponding to the read operation may be output and cached, an in addition, data from a different location may also be pre-fetched and cached. A memory device 900 may include some of the same sections as FIGS. 8A to 8C, accordingly, like sections are referred to with the same reference character but with the first digit being a "9" instead of an "8".

In the embodiments of FIGS. 9A to 9C, it is assumed that rank 918-1 stores first data "Dy" and rank 918-0 stores second data "Dz" at separate addressable locations. Further, as in the case of FIGS. 8A to 8C, data Dz is good pre-fetch candidate with respect to data Dy. It is also assumed that neither data Dy nor data Dz has been cached within module memory device 902.

Referring to FIG. 9A, a memory device 900 may receive address and control values 920 (shown by a bold line) that indicate a read request for data Dy at address ADDy (stored within rank 918-1). Further, such address and control signals are provided to module cache device 902 by isolation buffer 938. However, unlike the embodiments of FIGS. 8A to 8C, a comparison by module cache device 902 indicates a cache miss. In response to such a read cache miss, or regardless of such a miss, address and control signals (READ ADDy) may be applied to rank 918-1 (and optionally rank 918-0).

Referring to FIG. 9B, in response to read address and control data, data READ Dy may be output from rank 918-1. Such read data (Dy[0:71]) may be output onto controller connections 912-1 by isolation buffer 940-1. Further, such read data (Dy[0:71]) may also be cached within module cache device 902. In addition, module memory device 902 may generate a pre-fetch signals (PRE-FETCH READ ADDz) for pre-fetching data Dz within rank 918-0. Such address and control signals may be output on memory control connections 914-0 and provided to the memory circuits 916-00 to 916-08 of rank 918-0 (and optionally to the memory circuits of rank 918-1). It is noted that such pre-fetch signals may be generated may prior to, coincident with, or after the output read data Dy[0:71].

Referring to FIG. 9O, in response to the pre-fetch address and control signals (PRE-FETCH READ ADDz), memory circuits 916-00 to 916-08 of rank 918-0 may output pre-fetched data 958 (PRE-FETCH Dz) which may be received by module cache device 902 on memory control connections 914-1. In the particular embodiment shown, module cache device 902 may place isolation buffer circuits 940-0 and 940-1 into high impedance states, and store the cached data (Dz[0:71]).

In one embodiment, a module cache device 902 may be a dual port device that may allow data to be received concurrently at two different data ports. In such an arrangement, read data (e.g., Dy[0:71] in FIGS. 9A to 9C) may be output and cached at the same time pre-fetch data (e.g., Dz[0:71] in FIGS. 9A to 9C) is cached.

In this way, a memory device may pre-fetch stored data in response to a cache miss to increase the possibility of another cache hit in a subsequent access operation.

It is noted that in some embodiments, in response to a cache miss, module cache device may pre-fetch data from a same rank as the data being accessed for the read operation or a different rank as the data being accessed. Still further, in embodiments in which a module cache device is connected to multiple modules (e.g., FIG. 32 below), a module cache device may pre-fetch data from a different module than that storing the data being accessed by a read operation.

Figure 10:
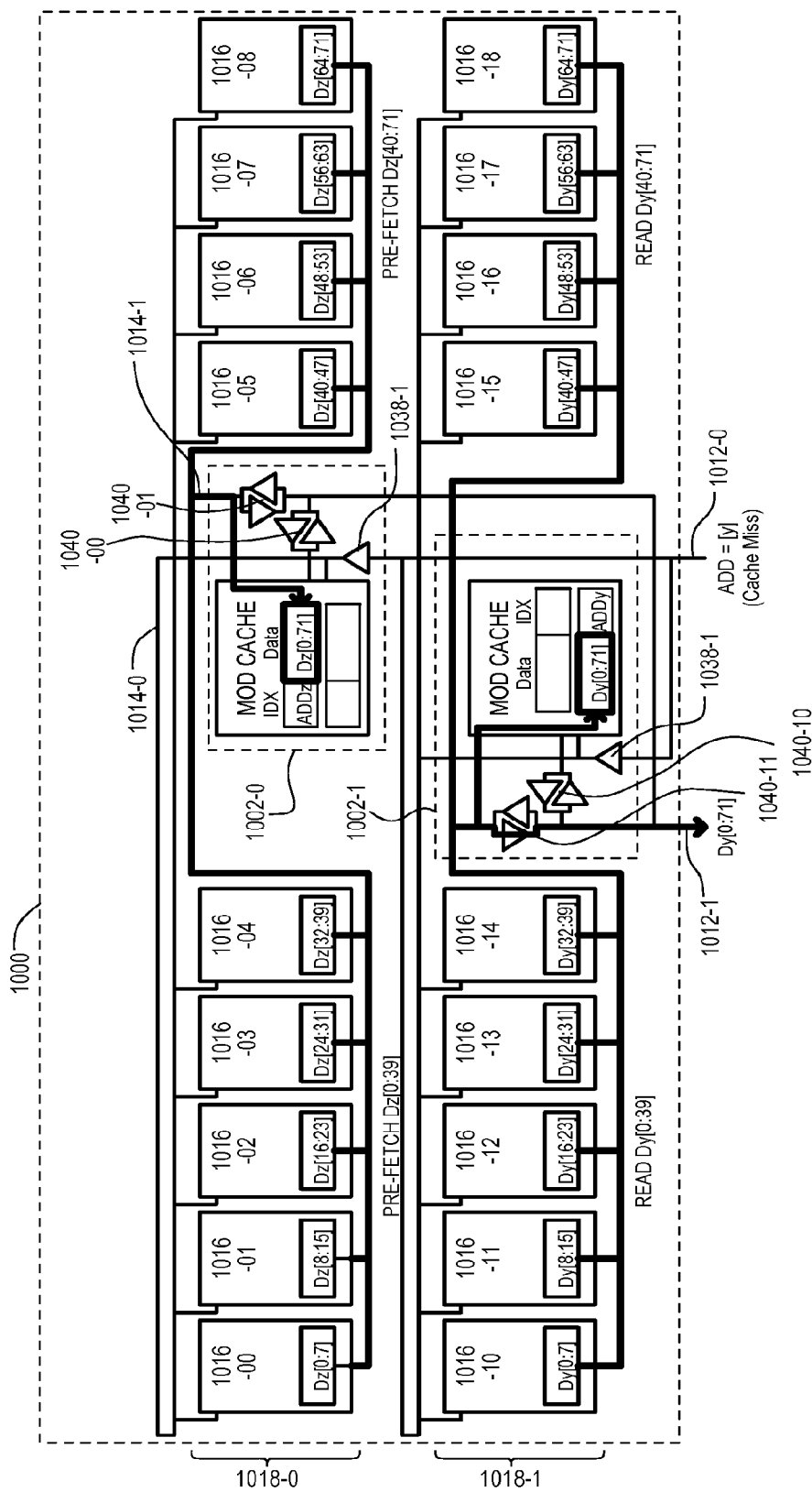
FIG. 10 is a block schematic diagram of a memory device and corresponding data pre-fetch on miss operation according to another embodiment.

Referring now to FIG. 10, a memory device and methods according further embodiments will now be described in a block diagram. FIG. 10 shows another example of a "pre-fetch between ranks on miss" type of operation. A memory device 1000 may include some of the same sections as FIGS. 9A to 9C, accordingly, like sections are referred to with the same reference character but with the first digits being "10" instead of a "9".

Unlike the embodiment of FIGS. 9A to 9C, a memory device 1000 may include two module cache devices 1002-0 and 1002-1, one corresponding to each rank 1018-0 and 1018-1. In one embodiment, module cache device 1002-0 may cache data from rank 1018-0, while module cache device 1002-1 may cache data from rank 1018-1.

Like the embodiment of FIGS. 9A to 9C, it is assumed that rank 1018-1 stores first data "Dy" and rank 1018-0 stores second data "Dz" at separate addressable locations. Further, as in the case of FIGS. 9A to 9C, data Dz is good pre-fetch candidate with respect to data Dy. It is also assumed that neither data Dy nor data Dz has been cached within either of module memory devices 1002-0 or 1002-1.

Referring to FIG. 10, it is assumed that a memory device 1000 receives address and control signals 1020 that indicate a read request for data Dy at address ADDy (stored within rank 1018-1) by way of isolation buffers 1038-0 and 1038-1. It is also assumed that module cache device 1002-1 indicates a cache miss for data in its corresponding rank 1018-1, while module cache device 1002-0 also indicates a cache miss (as the data is not stored in its corresponding rank 1018-0).

Referring still to FIG. 10, in response to read address and control data, data READ Dy may be output from rank 1018-1. Such read data (Dy[0:71]) may be output onto controller connections 1012-1 by isolation buffer 1040-11. Such data (Dy[0:71]) may also be cached within corresponding module cache device 1002-1.

In addition, the other module memory device 1002-0 may generate a pre-fetch address (ADDz) and corresponding read control signals for pre-fetch data Dz to thereby pre-fetch data PRE-FETCH Dz from rank 1018-0. As shown in FIG. 10, in response to such a pre-fetch address and control, such pre-fetch data PRE-FETCH Dz[0:71] may be output from rank 1018-0 and cached within corresponding module memory cache device 1002-1.

In this way, a memory device may pre-fetch stored data in response to a cache miss, where such pre-fetched data is stored in a cache device different from that corresponding to the cache miss.

Figure 11:
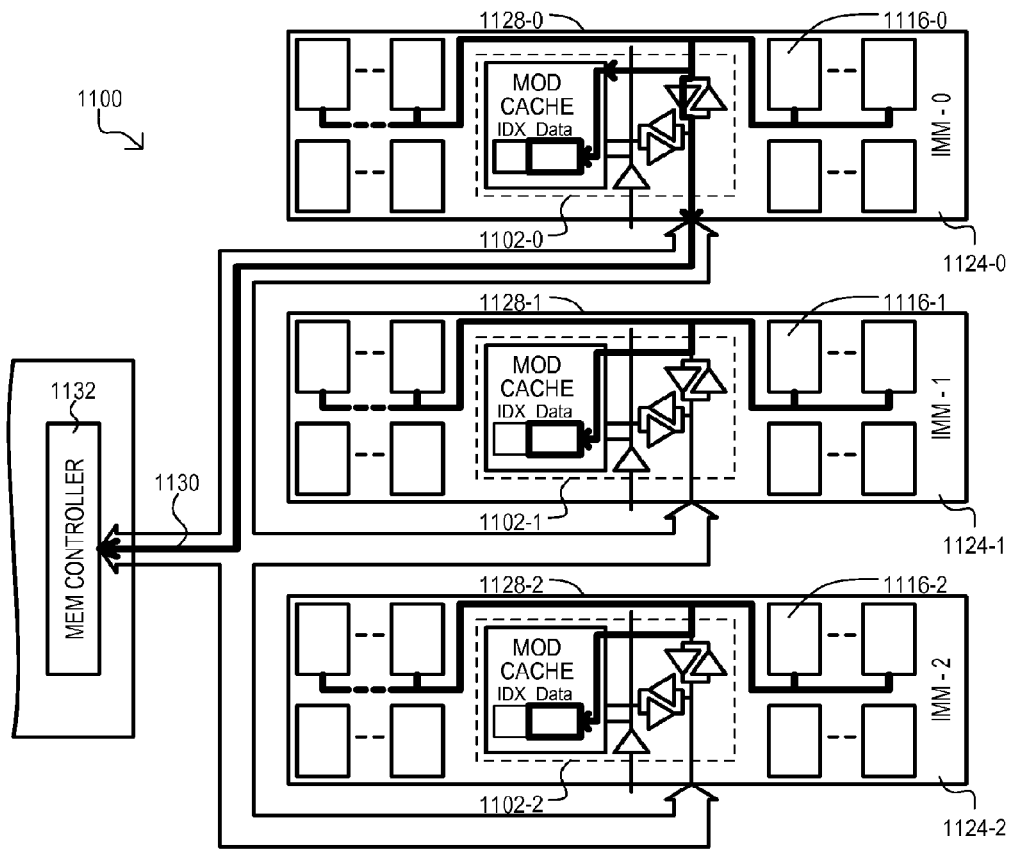
FIG. 11 is a block schematic diagram of a memory device and corresponding data pre-fetch on miss operation according to a further embodiment.

Referring now to FIG. 11, a memory device according to a further embodiment is shown in a block schematic diagram, and designated by the general reference character 1100. A memory device 1100 may include a number of IMMs 1128-0 to 1128-2 connected to a memory controller 1132 by channel bus 1130.

Each IMM (1128-0 to 1128-2) may include a number of memory devices (one shown in each IMM as 1116-0, 1116-1 and 1116-2), as well as a corresponding module cache device 1102-0 to 1102-2. In addition, each module cache device 1102-0 to 1102-3 may be capable of determining when a cache hit or miss occurs in the other IMMs (i.e., module cache device 1102-0 may determine when cache hits or misses occur in any of IMMs 1128-0 to 1128-2).

Referring to FIG. 11, it is assumed that IMMs (1128-0 to 1128-2) each receive address and control signals (not shown) that indicate a read request for data stored within IMM 1128-0. It is also assumed that module cache device 1102-0 of IMM 1128-0 indicates a cache miss. At the same time, cache devices 1102-1 and 1102-2 of the other IMMs 1128-1 and 1128-2 may also detect this cache miss, even though the access is not to data stored within their respective IMMs.

Referring still to FIG. 11, within IMM 1128-0, which stores data corresponding to the read request, in response to the received read address and control data, read data (shown by bold lines) may be output onto channel bus 1130 to memory controller 1132. Such read data may also be cached within corresponding module cache device 1102-0.

Within IMM 1128-1 and/or 1128-2, neither of which stores data corresponding to the read request, in response to the received read address and control data, data may be pre-fetched (shown by bold lines) from predetermined locations and cached in corresponding module cache devices 1102-1 and/or 1102-2.

While FIG. 11 shows module cache devices that may be capable of determining when a cache hit or miss occurs in the other IMMs, in other embodiments, in which there are one or more module cache devices on an same in line module, such module cache devices may be capable of determining when a cache hit or miss occurs in a cache device of the same IMM, or the other IMMs.

In this way, in response to a cache miss in one memory module, a memory device may pre-fetch and cache data in module cache devices corresponding to other memory modules or other portions of a same memory module.

Figure 12:
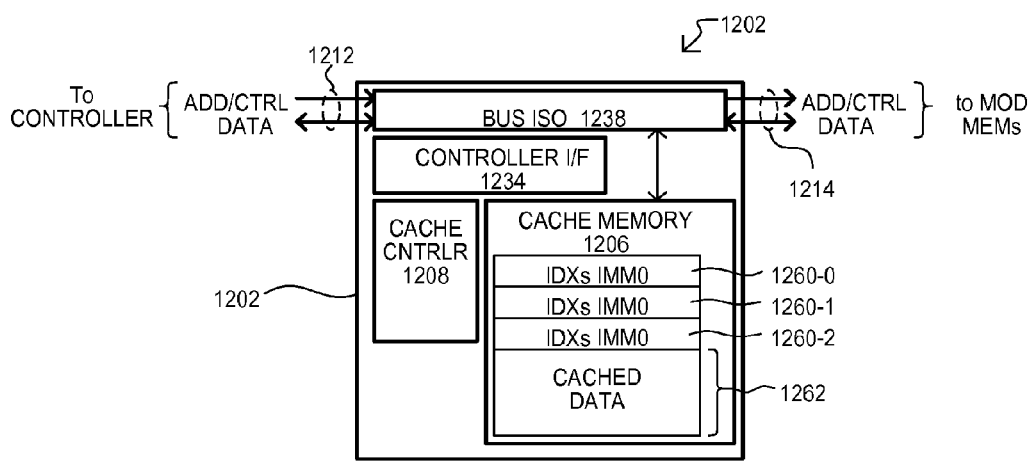
FIG. 12 is a block schematic diagram of a module cache device that may monitor cache compare results for multiple modules according to an embodiment.

Referring now to FIG. 12, one example of a module cache device that may be included in an embodiment like that of FIG. 11 is shown in a block schematic diagram and designated by the general reference character 1202. A module cache device 1202 may include some sections like those shown in 402 of FIG. 4, accordingly, like items are shown by the same reference characters but with the first digits being "12" instead of "4".

In the particular embodiment of FIG. 12, a module cache device 1202 may differ from that of FIG. 4, in that a cache memory 1206 may include index groups 1260-0 to 1260-2 as well as cached data 1262. Index groups (1260-0 to 1260-2) may store index values for cache locations corresponding to module cache devices on all modules in a multiple module arrangement. An index may be a value that is compared against other values to determine if cache hit or cache miss occurs.

In one embodiment, cached data 1262 stores cached data values corresponding to only one index group (1260-0 to 1260-2). Thus, assuming that module cache device 1202 is included on a memory module IMM0, when module cache device 1202 determines a cache miss has occurred for a data value on its module, it may output and cache such data. However, when module cache device 1202 determines a cache miss has occurred for a data value on another module, it may pre-fetch data and cache such data.

By including at least cache index values of for all cached data locations (e.g., including those cached by module cache devices on other modules), potential bus contention created by modules simultaneously accessing a common data bus may be prevented, as the other modules may be aware when a cache hit will be processed by another module.

In this way, module cache device may include cache index values for modules in addition to a module on which it is amounted.

Figure 13:
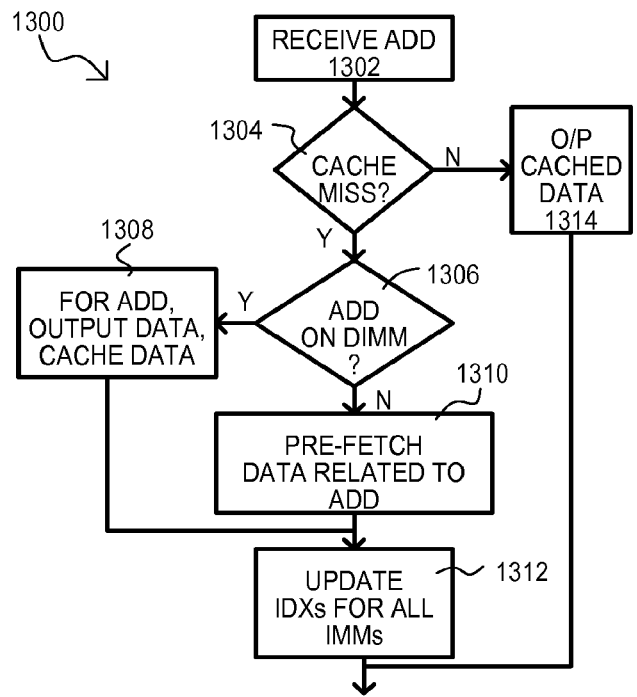
FIG. 13 is a flow diagram of a pre-fetch method according to an embodiment.

Referring to FIG. 13, a method according to an embodiment is shown in a flow diagram and designated by the general reference character 1300. A method 1300 may pre-fetch data in the event of a cache miss on another module. A method 1300 may include receiving an address value (box 1302). From such an address value, a cache miss determination may be made (box 1304). It is noted that in such a compare operation, a hit determination is made against index values across multiple modules.

In the event of a cache miss (Y from 1304), if the address corresponds to a particular module (Y from box 1306), the data for such an address may be output and cached. If the address does not correspond to the module (N from box 1306), data related to the address may be pre-fetched and cached (box 1312). Indices for all modules may then be updated (box 1312) to reflect the newly cached data.

In the event of a cache hit (N from 1304), data may be output (box 1314).

In this way, data may be pre-fetched in multiple modules in the event of a cache miss on a different module.

By including a module cache device as shown in the embodiments herein and equivalents, an access time in the event of a cache hit may be less than that of a cache miss. In particular embodiments, a module cache device may return a signal to a corresponding memory controller to indicate a cache hit, to thereby enable the memory controller to account for the faster access time. One particular embodiment having such an arrangement is shown in FIG. 14.

Figure 14:
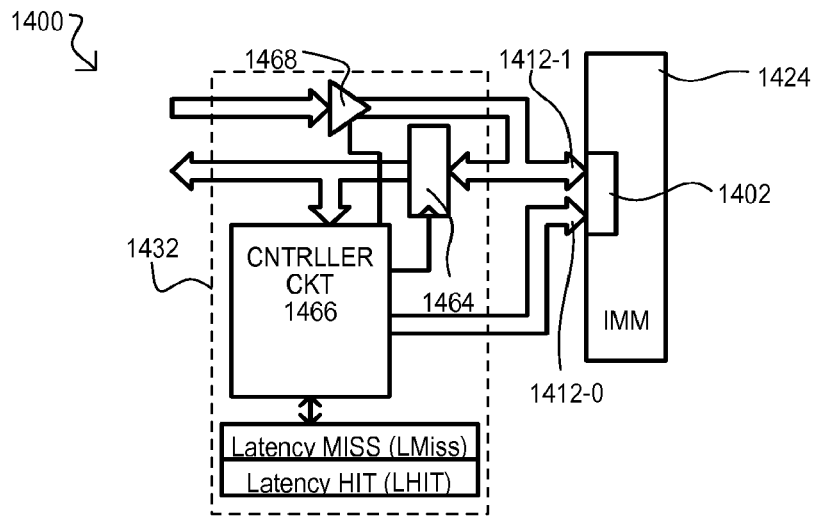
FIG. 14 is a block schematic diagram of a memory device that may provide a variable latency based on a cache compare result according to an embodiment.

Referring to FIG. 14, a memory device according to an embodiment is shown in a block diagram and designated by the general reference character 1400. A memory device 1400 may include a module cache device 1402 that may be connected to a memory controller 1432. A module cache device 1402 may return a predetermined signal to a memory controller 1432 in the event of a cache hit.

A module cache device 1402 may be part of a memory module that includes a circuit board 1424 which may include a number of memory devices. In one particular embodiment, a circuit board 1424 may be an IMM, with a module cache device 1402 being a separate integrated circuit than memory circuits also attached to the IMM.

A module cache device 1402 may be attached to a memory controller 1432 by controller connections 1412-0 and 1412-1. Controller connections 1412-0 may provide control and address signals, and in one particular embodiment, may be one-way connections from memory controller 1432 to module cache device 1402. In alternate embodiments, controller connections 1412-0 may include a bi-directional path and/or a one-way signal path from module cache device 1402 to memory controller 1432 that may enable a cache indication to be sent to the memory controller 1432. Controller connections 1412-1 may provide data values, and in one embodiment may be bi-directional allowing read data to be output to memory controller 1432 or write data to be input from memory controller 1432. In alternate embodiments, controller connections 1412-1 may include separate one-way signal paths for read and write data.

A memory controller 1432 may include a data input circuit 1464, a controller circuit 1466, and data driver circuits 1468. A data input circuit 1464 may allow data from module cache device 1402 to flow through to controller circuit 1466. A data driver circuit 1468 may drive data for input to module cache device 1402. A controller circuit 1466 may monitor a cache hit indication from module cache device 1402, and in response, alter a latency at which read data is received (e.g., latched) and/or write data is driven by data driver circuit 1468. In the very particular embodiment of FIG. 14, a memory controller 1432 may have storage locations for two or more latency values to enable controller circuit 1466 to alter operations based on detecting a cache hit or miss. FIG. 14 shows two particular values Latency MISS (LMiss) and Latency HIT (LHIT). However, such values may be "hardwired" into a circuit or inherent in a circuit response.

In this way, a module cache device may provide a cache hit indication to a memory controller. In addition or alternatively, a memory controller may respond with different latencies depending upon a cache hit indication from a module cache device.

Figure 15:
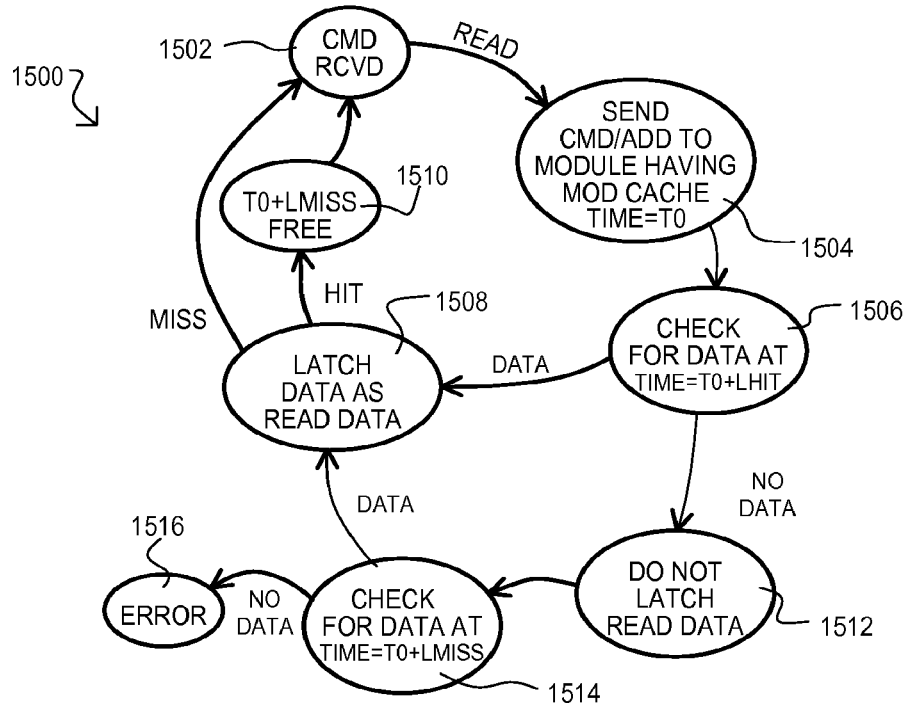
FIG. 15 is a state diagram representing a variable latency read implementation according to one embodiment.

Referring to FIG. 15, one embodiment of a memory controller read operation is shown in a state diagram 1500. If a READ command is received (READ from 1502), suitable command and address signals may be generated and sent at a time t0 (1504). After a hit latency time period (T0+LHIT), a check for data may be made (1506). A hit latency time period may be the time at which read data may be expected in the event of a cache hit within a module cache device receiving the command and address signals. If data are detected after this latency period (DATA from 1506), such data may be latched as read data (1508). As but one example, a clocking value (e.g., data "strobe") associated with data information values may indicate the presence of read data to be latched. Such clocking values may leading or be coincident with read data. Alternatively, actual data information signals may indicate the presence of data. Once read data are latched, and cache hit has been acknowledged (HIT from 1508), a memory controller may determine that a MISS latency time period for the command is free (1510).

If data are not detected after the hit latency period (NO DATA from 1506), after a miss latency time period (T0+LMISS), a check for data may be made (1514). A miss hit latency time period may be the time at which read data may expected in the event of a cache miss within a module cache device. If data are detected after this latency period (DATA from 1514), such data may be latched as read data (1508). Once read data are latched in response to a cache miss (MISS from 1508), a memory controller may await another command. If data are not detected after the miss latency period (NO DATA from 1514), an error state may be indicated (1516).

In this way, a memory controller may alter read timing in response to a cache hit indication from module cache device.

Figure 16:
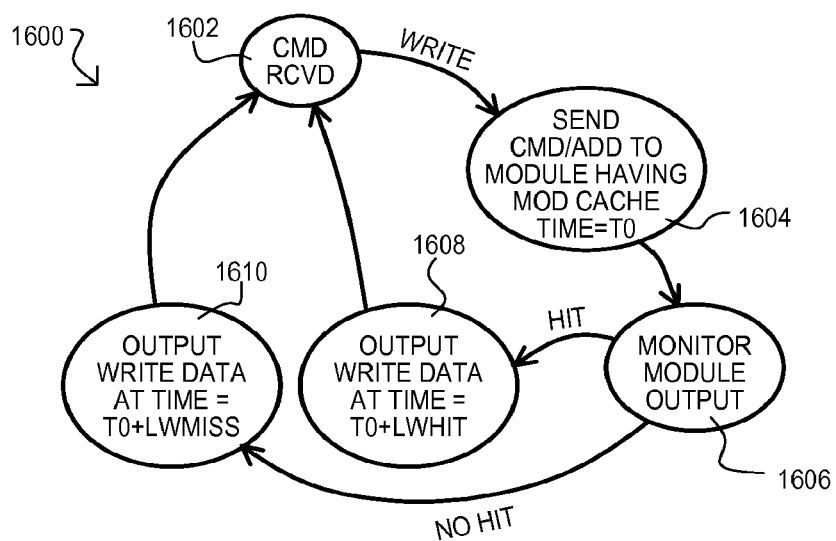
FIG. 16 is a state diagram representing a variable latency write implementation according to one embodiment.

Referring to FIG. 16, one embodiment of a memory controller write operation is shown in a state diagram 1600. If a WRITE command is received (WRITE from 1602), suitable command and address signals may be generated and sent at a time t0 (1604). A memory controller may then monitor a module output (1606). If a cache hit is detected (HIT from 1606), a memory controller may output write data after a hit latency time period (T0+LWHIT) (1608). If a cache hit is not detected (NO HIT from 1606), a memory controller may output write data after a miss latency time period (T0+LWMISS) (1610), where the miss latency time period is greater than the hit latency time period.

In this way, a memory controller may alter write timing in response to a cache hit indication from module cache device.

Figure 17A:
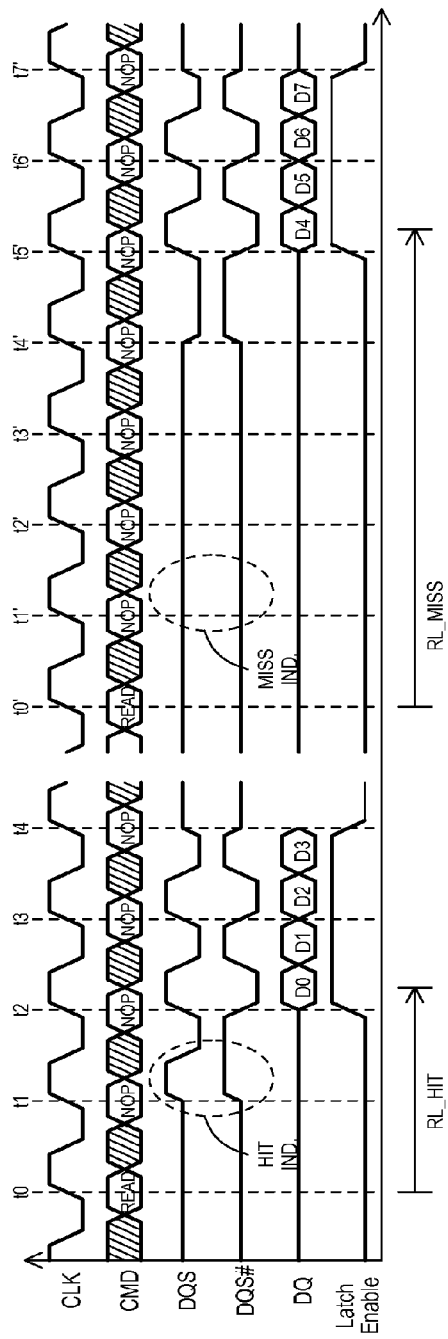
FIGS. 17A and 17B are timing diagrams showing read and write operations having both cache hits and cache misses according to very particular embodiments.

Referring now to FIG. 17A, very particular read operations according to embodiments are shown in a timing diagram. FIG. 17A includes waveforms CLK, CMD, DQS, DQS#, DQ, and Latch Enable. A waveform CLK may be a clock signal on which a timing for a module cache device and corresponding memory circuits may be based. A waveform CMD may correspond to commands resulting from one or more control signals issued by a memory controller. Waveforms DQS and DQS# may be signals on data strobe bus lines that may be activated by a module cache device in a read operation. A waveform DQ may indicate a state of a data bus. A waveform Latch Enable may indicate signals generated by a memory controller to latch read data.

Referring to FIG. 17A, at time t0, a read command (READ) may be issued by a memory controller. It is assumed that such a read command results in a cache hit. In response to such a read command, after time t1, a module cache device may drive data strobes DQS and DQS# in a particular fashion to indicate a cache hit. In the very particular embodiment shown, a cache hit may be indicated by driving both strobe values (DQS/DQS#) high. Because such a read operation is a cache hit, read data may be output in a shorter amount of time than a cache miss. In FIG. 17A, read data may be output at time t2. Accordingly, a "hit" read latency (RL_HIT) may be about 2 clock cycles. Also at time t2, a memory controller may activate signal Latch Enable to store data (D0, D1, D2, D3) on bus DQ as valid read data.

Referring still to FIG. 17A, at time t0' another read command (READ) may be issued by a memory controller. However, for this read command it is assumed that a cache miss results. In response to such a read command, after time t1', data strobes (DQS/DQS#) may indicate a miss. In the very particular embodiment shown, a cache miss may be indicated by both strobe values (DQS/DQS#) remaining at an inactive (in this embodiment, intermediate voltage) state. Because such a read operation is a cache miss, it may take a longer amount of time to output read data as compared to a cache hit. In FIG. 17A, such cache miss read data may be output at time t5'. Accordingly, a "miss" read latency (RL_MISS) may be about 5 clock cycles. Also at time t5', a memory controller may activate signal Latch Enable to store data (D4, D5, D6, D7) on bus DQ as valid read data.

Figure 17B:
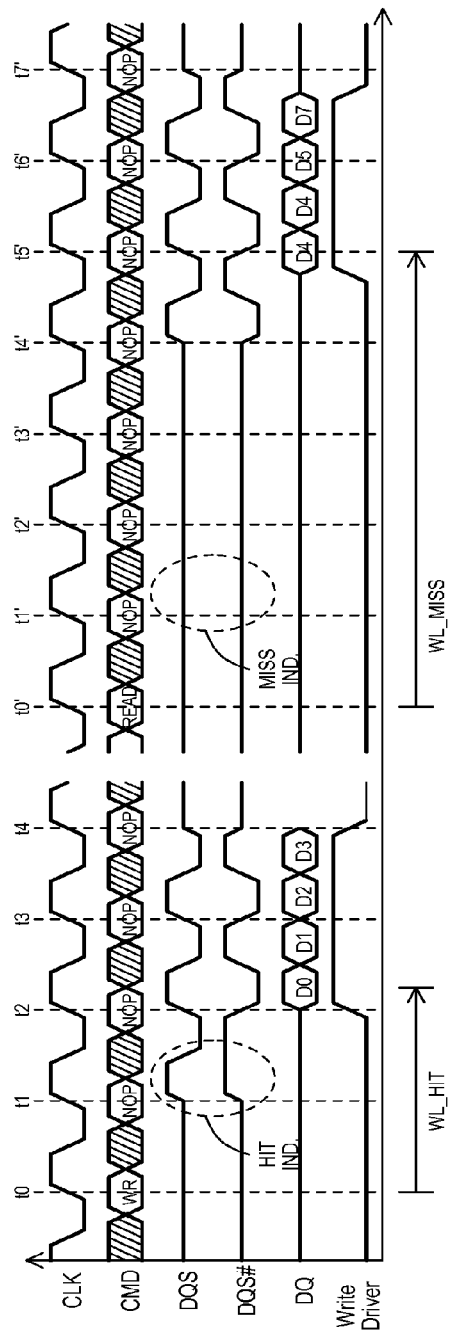

Referring now to FIG. 17B, very particular write operations according to embodiments are shown in a timing diagram. FIG. 17B includes waveforms CLK, CMD, DQS, DQS#, DQ, and Write Driver. Waveforms CLK, CMD may be same as in FIG. 17A. Waveforms DQS, DQS# and DQ may be the same as FIG. 17A, however, DQS/DQS# values may be driven by the memory controller and the module cache device, while DQ values may be driven by memory controller. A waveform "Write Driver" may indicate signals generated by a memory controller to drive write data on bus DQ.

Referring to FIG. 17B, at time t0, a write command (WR) may be issued by a memory controller. It is assumed that such a write command results in a cache hit. In response to such a write command, after time t1, a module cache device may drive data strobes DQS and DQS# in a particular fashion to indicate a cache hit. In the very particular embodiment shown, a cache hit may be indicated in the same manner as FIG. 17A. Because such a write operation is a cache hit, a storage location for write data may be ready in a shorter amount of time than a cache miss. In FIG. 17B, write data (D8, D9, D10, D11) may be driven after time t2. Accordingly, a "hit" write latency (WL_HIT) may be about 2 clock cycles.

Referring still to FIG. 17B, at time t0' another write command (WR) may be issued by a memory controller. However, for this write command it is assumed that a cache miss results. In response to such a write command, after time t1', data strobes (DQS/DQS#) may indicate a miss. In the very particular embodiment shown, a cache miss may be indicated in the same fashion as FIG. 17A. Because such a write is a cache miss, storage locations for write data may not be ready as fast as is the case of a cache hit. In FIG. 17B, read data may be driven at time t5'. Accordingly, a "miss" write latency may be about 5 clock cycles.

In this way data strobe signals may be utilized to indicate a cache hit or miss for a memory controller.

According to embodiments, data writes to memory circuits on a module may occur through a module cache device. Examples of write operation policies according to various embodiments will now be described.

Figure 18A:
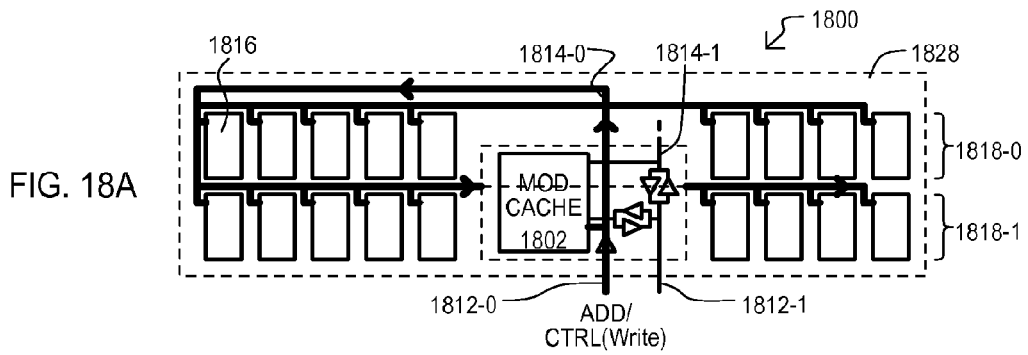
FIGS. 18A and 18B are block schematic diagrams of a memory device and a corresponding write through operation according to an embodiment.
Figure 18B:
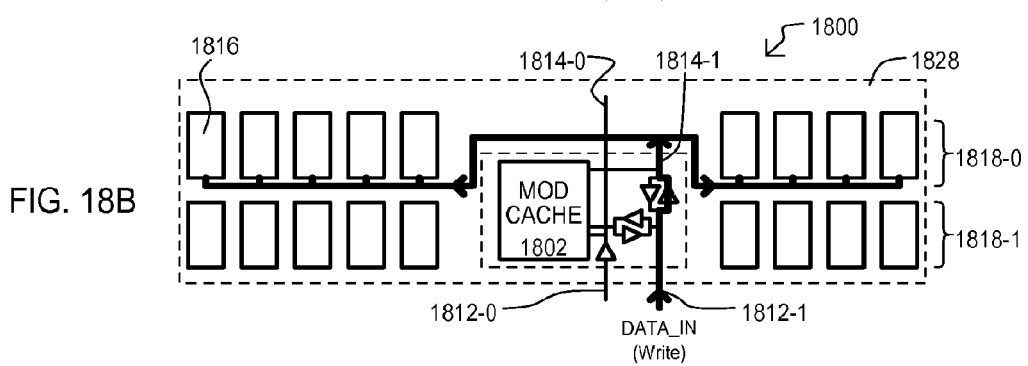

Referring to FIGS. 18A and 18B, a "write through" arrangement according to an embodiment is shown in a block schematic diagram. FIGS. 18A and 18B show a memory device 1800 that may include some of the sections shown in FIG. 8A, accordingly like sections are shown by the same reference character but with the first two digits being "18" instead of "8".

Referring to FIG. 18A, a memory device 1800 may receive control and address signals on controller connections 1812-0 that indicate a write operation to locations within memory circuits (one shown as 1816). Such control and address signals (shown by bold lines) may be driven by module cache device 1802 on memory control connections 1814-0.

Referring to FIG. 18B, subsequent to address and control signals, or in an alternate embodiments, concurrent with such signals, write data values may be received on controller connections 1812-1. As in the case of the address and control signals, write data values (DATA_ IN) may be driven by module cache device 1802 on memory control connections 1814-1 to apply write data to memory circuits (1816), in particular into rank 1818-0.

In the embodiment shown, a write operation may have substantially the same latency as a buffered write operation directly to memory circuits.

In this way, write operations may have a "write-through" policy.

Figure 19A:
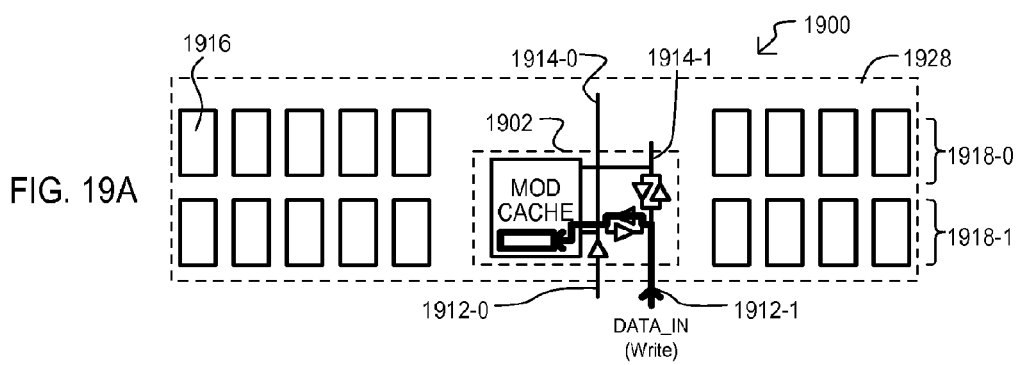
FIGS. 19A and 19B are block schematic diagrams of a memory device and a corresponding write back operation according to an embodiment.
Figure 19B:
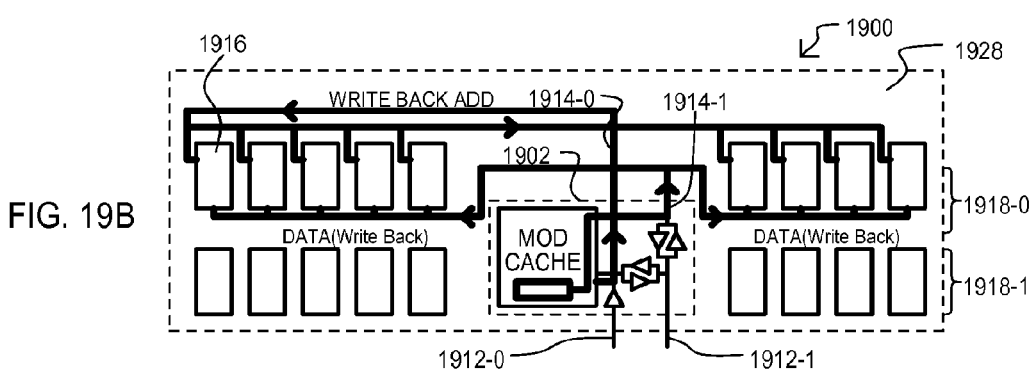

Referring to FIGS. 19A and 19B, a "write back" arrangement according to an embodiment is shown in a block schematic diagram. FIGS. 19A and 19B show a memory device 1900 that may include some of the sections shown in FIG. 8A, accordingly like sections are shown by the same reference character but with the first two digits being "19" instead of "8".

Referring to FIG. 19A, a memory device 1900 may receive control and address signals on controller connections 1912-0 as shown in FIG. 18A. Subsequent to such address and control signals, or in an alternate embodiments, concurrent with such signals, write data values may be received on controller connections 1912-1. However, unlike a write through policy like that of FIG. 18B, write data values (DATA_IN) may be stored within module cache device 1902.

Referring to FIG. 19B, after being stored in module cache device 1902, cached write data may be written into corresponding memory circuits (e.g., 1916). In one embodiment, module cache device 1902 may generate address and control signals on memory control connections 1914-0, and output the cached write data on memory control connections 1914-1 to apply write data to memory circuits (e.g., 1916). Such a write operation may be considered a "write-back". Write back actions may be based on various criteria. In one particular example, a write-back of a cached write value may occur when cached data is "evicted" based on a replacement policy.

It is noted that while module cache device 1902 is shown as a look-aside architecture, other write-back embodiments may include look-through architectures.

In the embodiment of FIGS. 19A and 19B, a write operation may have increased latency over buffered write operation directly to memory circuits (e.g., 1916).

In this way, write operations may have a "write-back" policy.

While embodiments, like that of FIG. 11, show IMMs with data connections on a same channel bus, alternate embodiments may include a data bus divided into portions, each portion being dedicated to an IMM or group of IMMs. One such embodiment is shown in FIG. 20.

Figure 20:
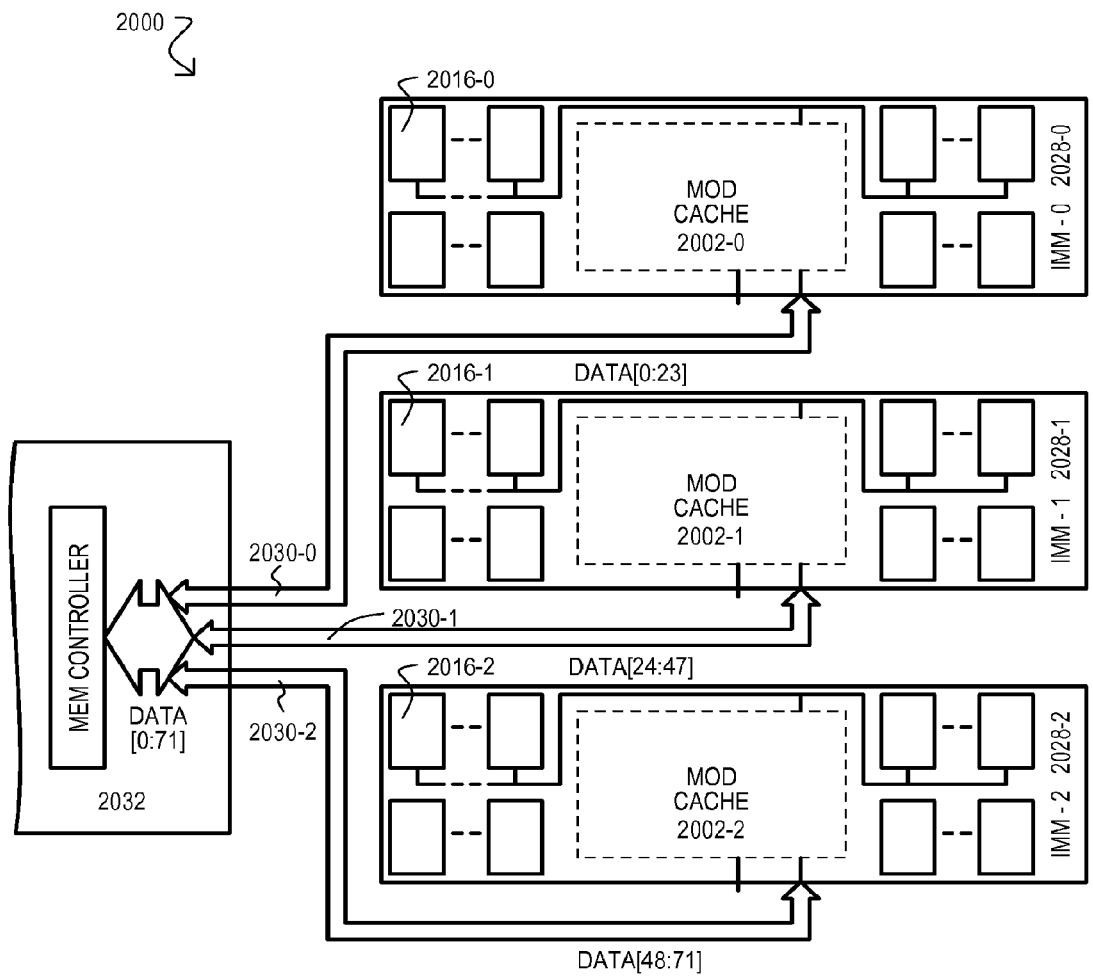
FIG. 20 is a block schematic diagram of a memory device that includes a system with striping across multiple memory modules.

Referring now to FIG. 20, a memory device according to a further embodiment is shown in a block schematic diagram, and designated by the general reference character 2000. A memory device 2000 may include a number of IMMs 2028-0 to 2028-2 connected to a memory controller 2032 by separate channel bus portions 2030-0 to 2030-2.

Each IMM (2028-0 to 2028-2) may include a number of memory devices (one shown in each IMM as 2016-0, 2016-1 and 2016-2), as well as a corresponding module cache device 2002-0 to 2002-2.

Referring still to FIG. 20, each channel bus portion (2030-0 to 2030-2) may provide a data path for one part of an overall accessed data location. In the very particular embodiment shown, channel bus portions (2030-0 to 2030-2) may each provide a path for ⅓ of a 72-bit data value. One way of conceptualizing such an arrangement is to consider 72-bit values being "striped" across IMMs (2028-0 to 2028-2).

A striping data arrangement may help prevent bus contention that might otherwise occur in cached system, as a cache hit may occur across all modules. Optionally, each module cache device 2002-0 to 2002-3 may have an arrangement like that of FIG. 12, and thus be capable of determining when a cache hit or miss occurs in the other IMMs, providing multiple ways of addressing possible bus contention. Such an arrangement, that combines striping with the storage of cache index data (e.g., "tag data"), may allow for increased capacity while at the same time avoiding bus contention by allowing multiple modules to be attached to each channel bus portion.

In this way, a memory device including module cache device on multiple modules, may strip data accesses across multiple modules.

The above embodiments have shown modules with module cache devices, as well as systems including such modules. In some embodiments it may be desirable to reduce power consumption in such modules. In particular, from a cache compare operation of a module cache device, it may be know which memory circuits are not accessed, and such memory circuits may be placed from a first power consuming state to a second, lower power consuming state. Particular embodiments having such a capability will now be described.

Figure 21A:
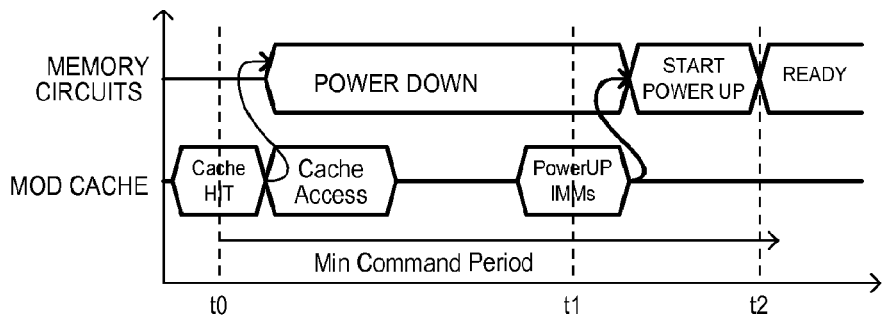
FIGS. 21A to 21D show a timing diagram and block schematic diagrams of a memory device and power down operation according to an embodiment.
Figure 21B:
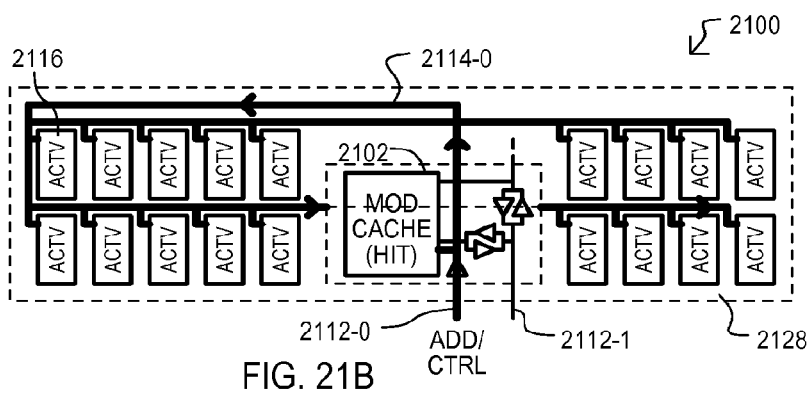

Referring to FIGS. 21A to 21B, a module power control operation according to one particular embodiment is shown in a timing diagram and sequence of block schematic diagrams.

Referring to FIG. 21A a timing shows two waveforms: "MEMORY CIRCUITS" which may show a power state of memory circuits on a module; "MOD CACHE" shows the operation of a module cache device on the same module.

Figure 21C:
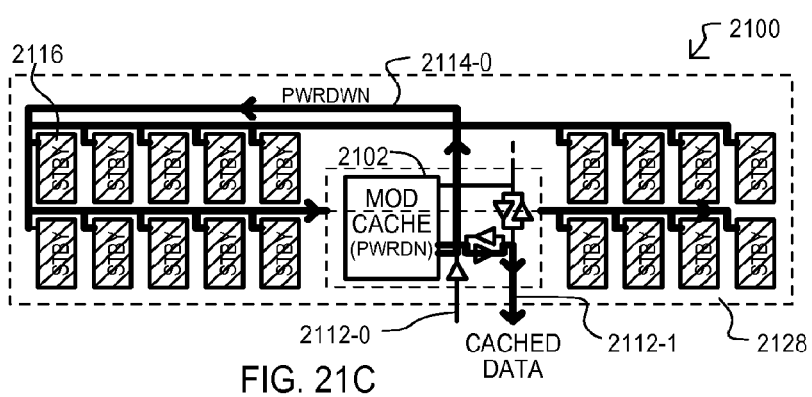
Figure 21D:
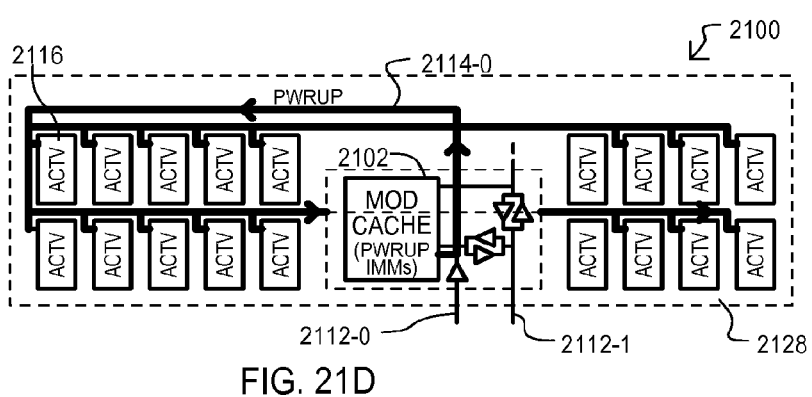

FIGS. 21B to 21D show a memory device 2100 that may include some of the sections shown in FIG. 8A, accordingly like sections are shown by the same reference character but with the first two digits being "21 instead of "8".

Referring to FIGS. 21A and 21B, at about time t0, a memory device 2100 may receive control and address signals on controller connections 2112-0 that indicate a read operation. Such control and address signals (shown by bold lines) may optionally be driven by module cache device 2102 on memory control connections 2114-0. It is assumed that the read operation generates a cache hit. It is also assumed that memory circuits (one shown as 2116) on the IMM 2128 are in a first power consuming state (ACTV).

Referring to FIGS. 21A and 21C, following the cache hit determination, within module cache device 2102, a cache access may take place, resulting in cached data being output on controller connections 2112-1 from module cache device 2012. In addition, module cache device 2102 may output control data on all or a portion of memory control connections 2114-0 that place memory circuits (e.g., 2116) of the IMM 2128 into a second power consuming state (STBY). A state STBY may consume less power than a state ACTV. This shown as POWER DOWN in FIG. 21A.

Referring to FIGS. 21A and 21D, at about time t1, a module cache device 2102 may output control data on all or a portion of memory control connections 2114-0 that place memory circuits (e.g., 2116) of the IMM 2128 once again into the higher power consuming state ACTV. The process of switching from a state STBY to ACTV is shown as POWER UP in FIG. 21A.

Referring again to FIG. 21A, at about time t2, memory circuits (e.g., 2116) of IMM 2128 may be in a state ACTV and thus ready to process commands. It is noted that in one embodiment, the time between receiving command data at about time t0, and the time at which memory circuits (e.g., 2116) are returned to a state ACTV may be less than a minimum command period. A minimum command period may be the minimum time expected between received commands. In such an arrangement, memory circuits may be powered down and then returned to a powered-up state before a next command is received. In particular embodiments, the speed at which a memory circuit (e.g., 2116) can process a command may be faster in the ACTV state as compared to the STBY state, and/or a memory circuit 2116 may not be capable of servicing a command in the STBY state.

It is noted that while FIGS. 21A to 21D show a power down operation in response to a cache compare operation (i.e., cache hit), other embodiments may power down memory circuits in response to other address values (i.e., address ranges). In one very particular embodiment, if a received address is outside of the range of addresses stored in corresponding memory circuits, such memory circuits may be powered down.

In this way, in response to particular addresses, a module cache device may place the memory circuits on the module into a lower power consuming state. In particular embodiments, a module cache device may return memory circuits to a previous higher power consuming state before a next command is expected.

Referring to FIGS. 22A to 22B, a module power control operation according to another particular embodiment is shown in a timing diagram and sequence of block schematic diagrams. FIG. 22A shows three waveforms: "MEM CKTs (Rank 0)" shows a power state of memory circuits of a first rank of a module (in this case an IMM); "MEM CKTs (Rank 1)" shows a power state of memory circuits of a second rank of a module; and "MOD CACHE" shows the operation of a module cache device on the same module.

FIGS. 22B to 22D show a memory device 2200 that may include some of the sections shown in FIG. 8A, accordingly, like sections are shown by the same reference character but with the first two digits being "22 instead of "8". It is noted that memory control connections (2214-00, 2214-01, and 2214-02) allow for separate control of Rank 0 2218-0 and Rank 1 2218-1 by cache memory device 2102. In some embodiments, separate rank control may not be possible by signals directly issued from a memory controller (e.g., signals received on controller connections (2212-0)).

Referring to FIGS. 22A and 22B, at about time t0, a memory device 2200 may receive control and address signals on controller connections 2212-0 that indicate a read operation. Such control and address signals (shown by bold lines) may be driven on memory control connections 2214-00 and 2214-02 to provide control and address signals to Rank 1 2218-1. Optionally, control signals on memory control connections 2214-01 may be driven on control connections 2214-01. It is assumed that the read operation generates a cache miss. It is also assumed that a read operation is directed to an address location within Rank 1 2218-0, and that circuits (one shown as 2216) of both ranks (2218-0 and 2218-1) are in a first power consuming state (ACTV).

Referring to FIGS. 22A and 22C, as shown by waveform MEM CKTs (Rank 1), in response to the read command, memory circuits (e.g., 2216) of Rank 1 2218-1 may be accessed, resulting in data (DATA (Rank 1)) being output on controller connections 2212-1 and cached within module cache device 2202. In addition, module cache device 2202 may output control data on memory control connection 2214-01 that places memory circuits (e.g., 2216) of the non-accessed rank Rank 0 2218-0 into a second power consuming state (STBY) that may consume less power than state ACTV. This is shown as POWER DOWN Rank 0 in FIG. 22A.

Referring to FIGS. 22A and 22D, at about time t1, a module cache device 2202 may output control data on memory control connections 2214-01 that place memory circuits of the non-accessed rank Rank 0 2218-0 once again into the higher power consuming state ACTV. The process of switching from a state STBY to ACTV is shown as "POWER UP Rank 0" in FIG. 22A.

Referring again to FIG. 22A, at about time t2, memory circuits of Rank 0 2218-0 may be once again by in the state ACTV, and thus ready to process commands. In one embodiment, the time between receiving command data at about time t0, and the time at which memory circuits (e.g., 2216) of Rank 0 are returned to a state ACTV may be less than a minimum command period. In such an arrangement, non-accessed memory circuits may be powered down and then returned to a powered-up state before a next command is received. As in the case of FIGS. 21A to 21D, the speed at which a memory circuit (e.g., 2216) can process a command may be faster in the ACTV state as compared to the STBY state, and/or a memory circuit 2216 may not be capable of servicing a command in the STBY state.

In this way, in response to a cache miss on a module, a module cache device may place non-accessed memory circuits on the module into a low power consuming state. In particular embodiments, a module cache device may return such non-accessed memory circuits to a higher power consuming state before a next command is expected.

Some embodiments may include memory circuits may be activated (e.g., activated or opened) prior to an access. In such embodiments, it may be desirable to reduce access times by activating non-accessed memory circuits in anticipation of subsequent accesses. Particular embodiments having such a capability will now be described.

Figure 23A:
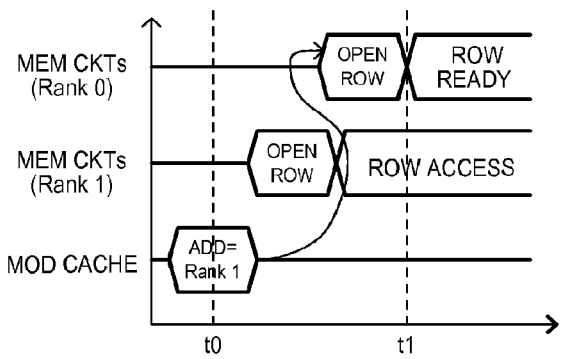
FIGS. 23A to 23C show a timing diagram and block schematic diagrams of a memory device and activation operation according to an embodiment.
Figure 23B:
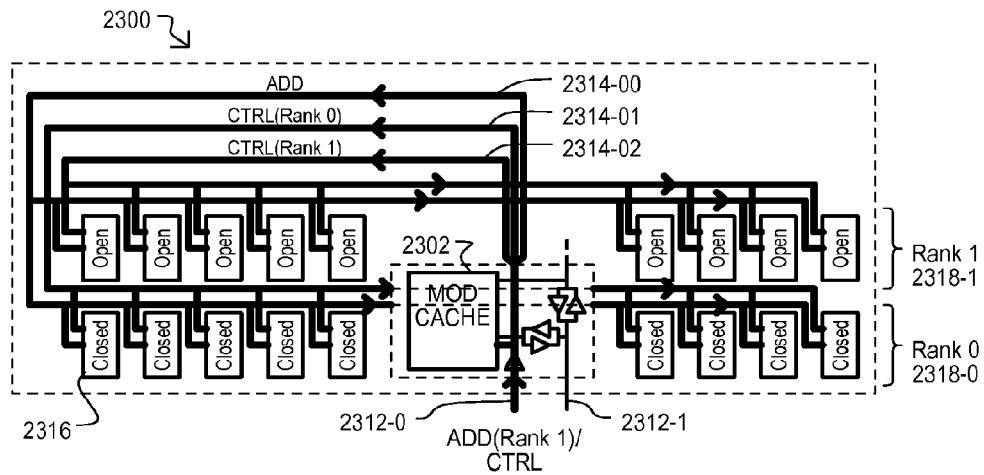
Figure 23C:
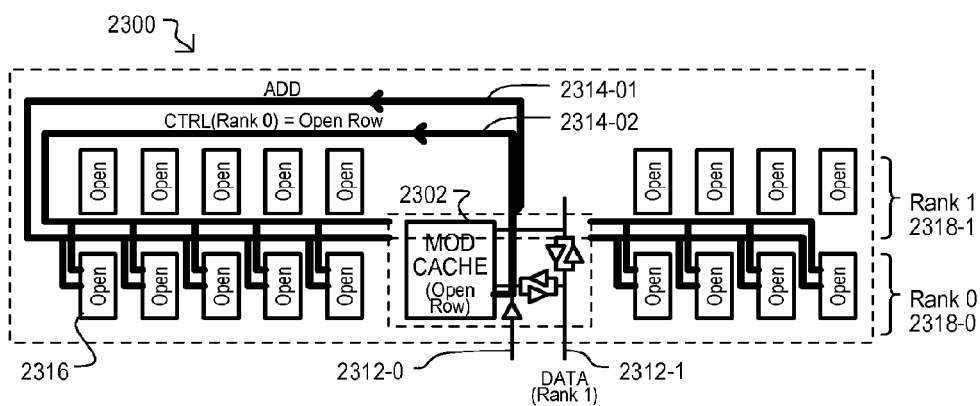

Referring to FIGS. 23A to 23C, a module control operation according to a particular embodiment is shown in a timing diagram and sequence of block schematic diagrams. FIG. 23A shows three waveforms: "MEM CKTs (Rank 0)" shows an operational state of memory circuits of a first rank of a module (in this case an IMM); "MEM CKTs (Rank 1)" shows an operational state of memory circuits of a second rank of a module; and "MOD CACHE" shows the operation of a module cache device on the same module.

FIGS. 23B and 23C show a memory system 2300 that may include some of the sections shown in FIG. 8A, accordingly, like sections are shown by the same reference character but with the first two digits being "23 instead of "8". It is noted that memory control connections (2314-00 to 2314-02) allow for separate control, and in particular embodiments, addressing of Rank 0 2318-0 and Rank 1 2318-1 by cache memory device 2302. In such an arrangement, address values may be shared for all ranks, while control values may be separate. In some embodiments, separate control and addressing of ranks may not be possible by a memory controller (e.g., not possible via signals received on controller connections (2312-0)).

Referring to FIGS. 23A and 23B, at about time t0, a memory device 2300 may receive control and address signals on controller connections 2312-0 that indicate an access operation. Such control and address signals (shown by bold lines) may be driven on memory control connections 2314-01 for Rank 1 2318-1, and optionally, on memory control connections 2314-00. It is assumed that the access operation generates a cache miss, further, that the access operation is directed to an address location within Rank 1 2318-1. Such an operation may result in memory circuits (one shown as 2316) of accessed Rank 1 2318-1 being activated from a first state (Closed) to a second state (Open). In the very particular embodiment of FIG. 23A, memory circuits (e.g., 2316) may be memory devices in which a row must be opened prior to being accessed. In such a particular embodiment, activating such a memory device may include opening a row on such a device.

Referring again to FIG. 23A, as shown by waveform MEM CKTs (Rank 1), in response to the access command and address, memory circuits (e.g., 2316) of Rank 1 2318-1 may have a row opened (OPEN ROW), and such a row may be subsequently accessed (ROW ACCESS).

Referring to FIGS. 23A and 23C, in response to the access directed to Rank 1 2318-1, a module cache device 2302 may output address and control data on memory control connection 2314-00 resulting in memory circuits (e.g., 2316) of the non-accessed rank Rank 0 2318-0 being activated from a first state (Closed) to a second state (Open).

Referring back to FIG. 23A, as shown by waveform MEM CKTs (Rank 0), in response to the access command and address, at about time t1, memory circuits (e.g., 2316) of Rank 0 2318-1 may have a row opened, and thus be accessed in a shorter amount of time than memory circuits that are closed.

In this way, in response to a cache miss on a module, a module cache device may place non-accessed memory circuits into an activated state for faster subsequent access than if such circuits were in a non-activated state.

Figure 24A:
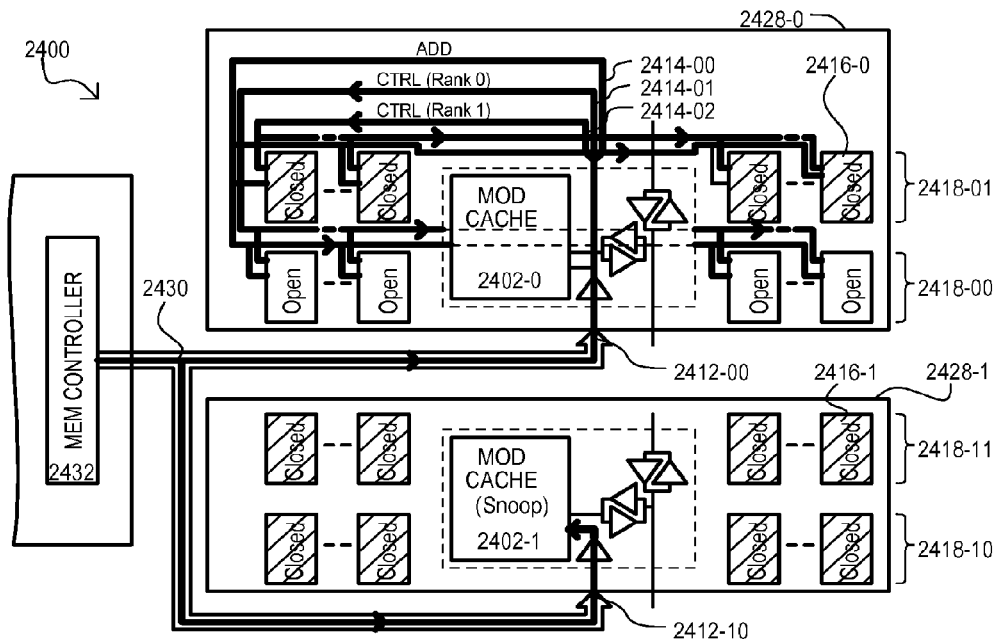
FIGS. 24A and 24B are block schematic diagrams of a memory device and corresponding activation operation according to an embodiment.
Figure 24B:
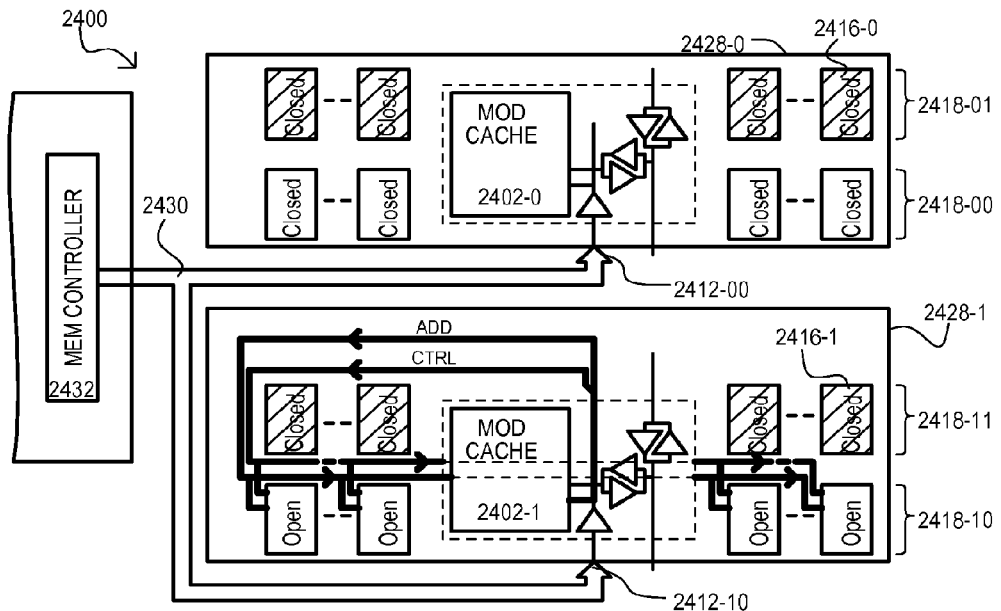

Referring to FIGS. 24A and 24B, a memory device system and operation according to another particular embodiment is shown in a sequence of block schematic diagrams. FIGS. 24A and 24B show a memory system 2400 that may include some of the sections shown in FIG. 11, accordingly like sections are shown by the same reference character but with the first two digits being "24 instead of "11".

In the embodiment of FIGS. 24A and 24B, like the embodiment of FIGS. 23B to 23C, memory control connections (2414-00 to 2414-02) may allow for separate control of ranks (2418-00, -01, -10, 11) on their respective IMMs 2428-0 and 2428-1.

Referring to FIG. 24A, a memory device 2400 may receive control and address signals on channel bus 2430 from memory controller 2432. Such address and control signals may be received module cache devices 2402-0 and 2402-1 on both IMMs (2428-0 and 2428-1). It is assumed that the access operation generates a cache miss, and further, that the access operation is directed to an address location within Rank 1 2418-00. Such an operation may result in memory circuits of rank 2418-00 being activated from a first state (Closed) to a second state (Open). The other rank 2418-01 of the same IMM 2428-0 may remain in the first state (Closed). It is understood that read data may then be output from, or write data input to, the accessed rank 2418-00.

Referring still to FIG. 24A, within the non-accessed IMM 2428-1, module cache device 2402-1 may operate in a "snoop" mode, detecting that IMM 2428-0 is being accessed. All memory devices (one shown as 2416-1) on the non-accessed IMM 2428-0 may remain in the first state (Closed).

Referring to FIG. 24B, in response to detecting an access to rank 2418-00 of the other IMM 2428-0, module cache device 2402-1 on non-accessed IMM 2428-1 may output address and control data on memory control connections 2414-12 and 2414-13 that result in memory circuits (e.g., 2416) of a rank (in this example rank 2418-10) being activated from the first state (Closed) to the second state (Open). This may enable rank 2418-10 to respond to an expected subsequent access without any activation time.

In this way, in response to a cache miss on a module, a module cache device on another module may place non-accessed memory circuits into an activated state for faster subsequent access than if such circuits were in a non-activated state.

Figure 25:
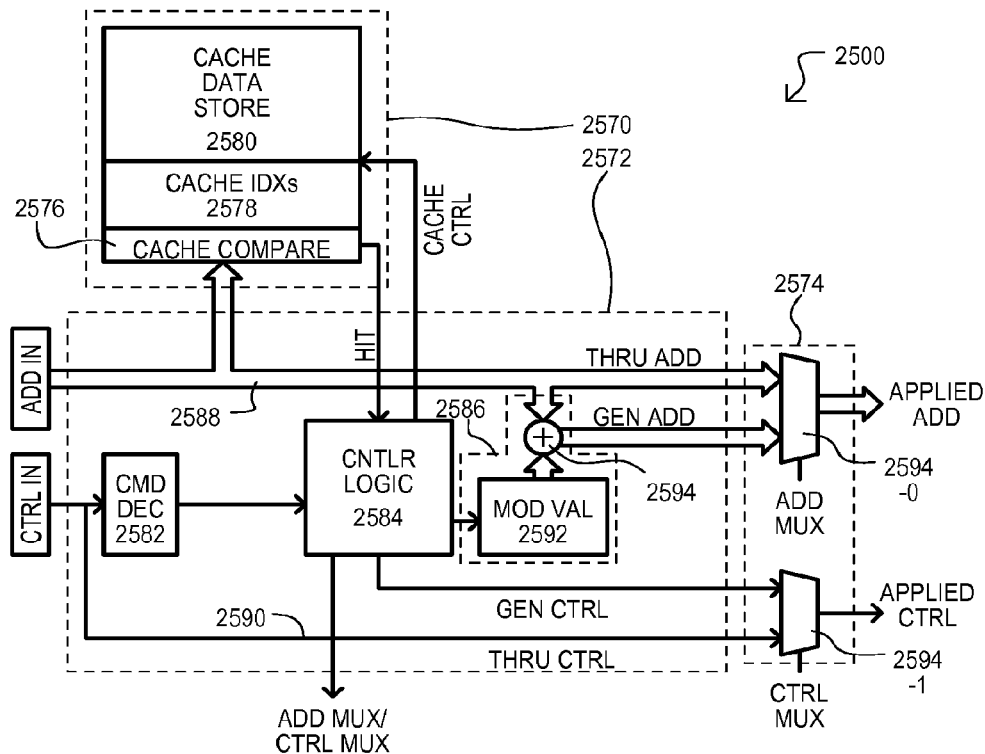
FIG. 25 is a block schematic diagram of a module cache device according to a further embodiment.

Referring now to FIG. 25, a memory device according to still another embodiment is shown in a blocks schematic diagram and designated by the general reference character 2500. Memory device 2500 may include a module cache controller that may be included in other embodiments shown herein.

A memory device 2500 may include a cache memory and compare section 2570, controller circuit 2572, and a bus control section 2574. A memory device 2500 may receive address and control data, and in response, forward such data to memory circuits (not shown), and/or generate additional address and control data to execute additional operations on such memory circuits (e.g., pre-fetch operations, power control operations, or activation operations).

A cache memory and compare section 2570 may include a cache compare circuit 2576, cache indices 2578, and a cache data store 2580. A cache compare circuit 2576 may compare address data to cache indices 2578 to thereby determine if a cache hit or miss has occurred. Such an indication may be provided as value "HIT" to controller circuit 2572. In some embodiments, a cache compare circuit 2576 may perform a predetermined operation on a received address value prior to a cache compare operation (e.g., address translation, bit ordering, or other functions).

Cache indices 2578 may be data values (e.g., tags) that indicate which data values have been cached within cache data store 2580. A cache data store 2580 may store cached data. In response to a cache hit, a data location within cache data store may be accessed. In the event of a cache miss, a new index may be generated within cache indices 2578, and a new data location within cache data store 2580 may be provided for such a new index. In particular embodiments, a cache compare circuit 2576 may operate in a "snoop mode", executing cache compare operations for addresses corresponding to memory circuits on other modules. In such a case, cache indices 2578 may include values for other modules (with cache data store 2580 not including data for values).

A controller circuit 2572 may receive address values (ADD IN) and control values (CTRL IN) from a memory controller (not shown), or the like. A controller circuit 2572 may also provide thru address values (THRU ADD) or generated address values (GEN ADD), as well as through control values (THRU CTRL) or generated control values (GEN CTRL). Through values (THRU ADD, THRU CTRL) may correspond to received address values (ADD IN, CTRL IN). That is, such through values may enable memory circuits to be controlled according to command values received from a memory controller, or the like. Generated values (GEN ADD, GEN CTRL) may be values generated by controller circuit

2572 to enable independent control of memory circuits and/or to modify command values received from a memory controller, or the like.

In the particular embodiment of FIG. 25, a controller circuit 2572 may include a command decoder 2582, controller logic 2584, an address modifier circuit 2586, an address through bus 2588, and a control through bus 2590. A command decoder 2582 may decode received control signals (CTRL IN) and thereby determine a type of command being received.

Controller logic 2584 may generate controls signals based on received command data from command decoder 2582, as well as cache hit indication HIT, and thereby control cache memory and compare section 2570, address modifier circuit 2588, and bus control section 2574.

An address modifier circuit 2586 may include a modifier values 2592 and optionally, an operator circuit 2594. Modifier values 2592 may be values for generating a new address from a received address. As but a few particular examples, modifier values 2592 may be used to generate a pre-fetch address corresponding to a received address, and/or addresses for powering down memory circuits in response to a cache compare result, and/or addresses for activating (e.g., opening) memory circuits in response a cache compare result. Modifier values 2592 may be programmable values, hardwired values, and/or values generated by a sequence of mathematical other operations, as but a few examples. An operator circuit 2594 may optionally be included for embodiments in which a generated address (GEN ADD) is generated by some operation on or with a received address. While operator circuit 2594 is shown as an adder, such a circuit may perform one or more different mathematical or other operations on a received address and/or modifier value to arrive at a generated address (GEN ADD). Such operations may include, without limitation, adding/subtracting an offset, encoding (including encryption), decoding (including decryption), hashing, or scrambling (including descrambling).

An address through bus 2588 may enable a received address value to "flow through" to provide a through address value (THRU ADD). Similarly, a control through bus 2590 may enable received control signal values to "flow through" to provide a through control values (THRU CTRL). In some embodiments, buses (2588 and/or 2590) may be buffered or unbuffered.

A bus control section 2574 may selectively output through address values (THRU ADD) or generated address values (GEN ADD), or through control values (THRU CTRL) or generated address values (GEN ADD). In the very particular embodiment of FIG. 25, a bus control section 2574 may include an address multiplexer (MUX) 2594-0 and a control MUX 2594-1. An address MUX 2594-0 may selectively output either of address values THRU ADD or GEN ADD in response to control value ADD MUX generated by controller logic 2584. In a similar fashion, an control MUX 2594-1 may selectively output either of control values GEN CTRL or THRU CTRL in response to control value CTRL MUX generated by controller logic 2584.

In this way, a memory device may receive address and control values, and output such values or other address and control values in response to a cache compare result.

Figure 26:
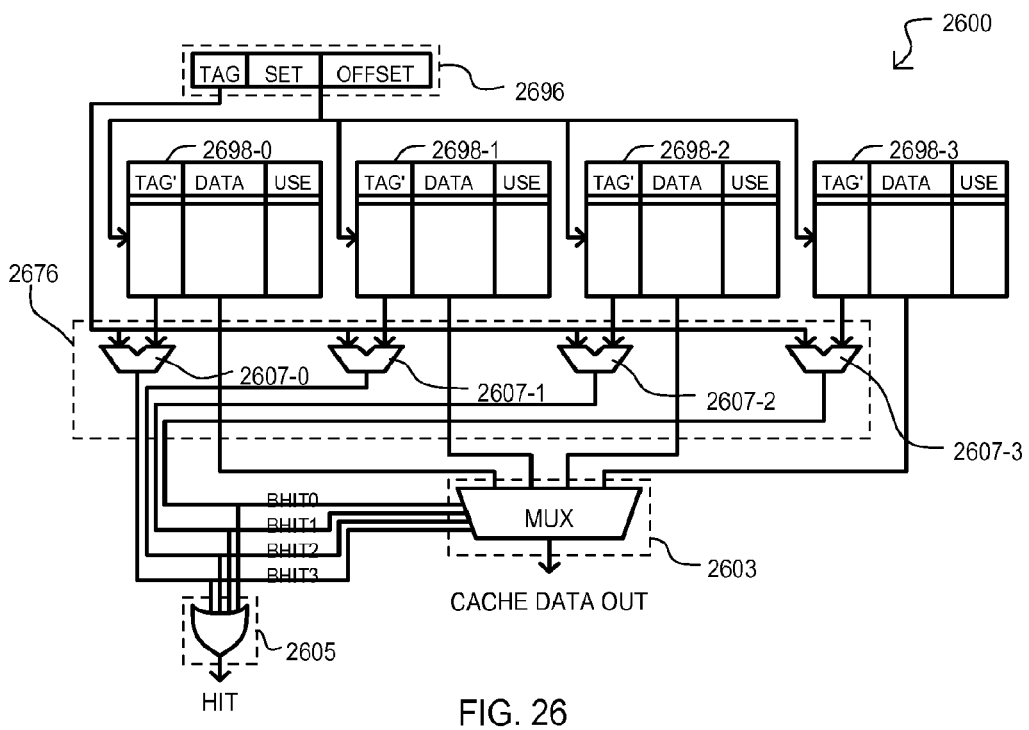
FIG. 26 is a block schematic diagram of a cache memory architecture that may be included in the embodiments.

Referring to FIG. 26, one very particular example of a cache architecture that may included in embodiments is shown in a block schematic diagram and designated by the general reference character 2600. A cache architecture 2600 may include a cache input 2696, one or more tag/data blocks 2698-0 to 2698-3, a compare section 2676, a cache data output control 2603, and hit logic 2605. A cache input 2696 may receive values TAG, SET and OFFSET in response to received address data. In one particular embodiment, there may be a one-to-one bit correspondence between address data and the fields TAG, SET and OFFSET. In an alternate embodiment, address translation or some other operation may generate values TAG, SET and OFFSET from a received address value.

Tag/data blocks (2698-0 to 2698-3) may include a number of entries accessible by values SET and OFFSET. Each such entry may include a cached tag value TAG', a cached data value DATA, and a USE value. A cached tag value TAG' may be used for comparison with an input TAG value, as will be described below. A cached data value DATA may be a cached data value for an address corresponding to the cached value TAG' and the SET and OFFSET values corresponding to the location. A USE value may indicate an entry's validity (is the entry used or available) and/or may indicate the last time an entry was used, or the number of times an entry has been used. Such a USE value can be used to dictate when a cache entry is to be freed up (i.e., evicted) for use by a new cache value. If a SET and OFFSET value correspond to an entry within a tag/data block (2698-0 to 2698-3) a corresponding tag value TAG' will be output to compare section 2676, and a corresponding data value DATA will be output to cache data output control 2603.

A compare section 2676 may compare a cached values TAG' to input value TAG to thereby determine if a hit has occurred in any tag/data block (2698-0 to 2698-3). In the very particular example of FIG. 26, compare section 2676 may include comparators 2607-0 to 2607-3, which may each compare an input tag value TAG to a cached tag value (TAG') output from tag blocks 2698-0 to 2698-3, respectively, to thereby generate a block hit indications BHIT0 to BHIT3.

A cache data output control 2603 may output cached data DATA corresponding to a hit within a given tag/data block (2698-0 to 2698-3). In the very particular embodiment of FIG. 26, a cache data output control 2603 may include a 4:1 MUX, having inputs to receive data values from each tag/data block (2698-0 to 2698-3), and an output that provides cached data. Control inputs to such a 4:1 MUX may be the block hit indications BHIT0 to BHIT3.

Cache hit logic 2605 may provide a HIT indication by logically combining block hit indications BHIT0 to BHIT3. In the very particular embodiment of FIG. 26, cache hit logic 2605 may logically OR block hit indications (BHIT0 to BHIT3).

Figure 27:
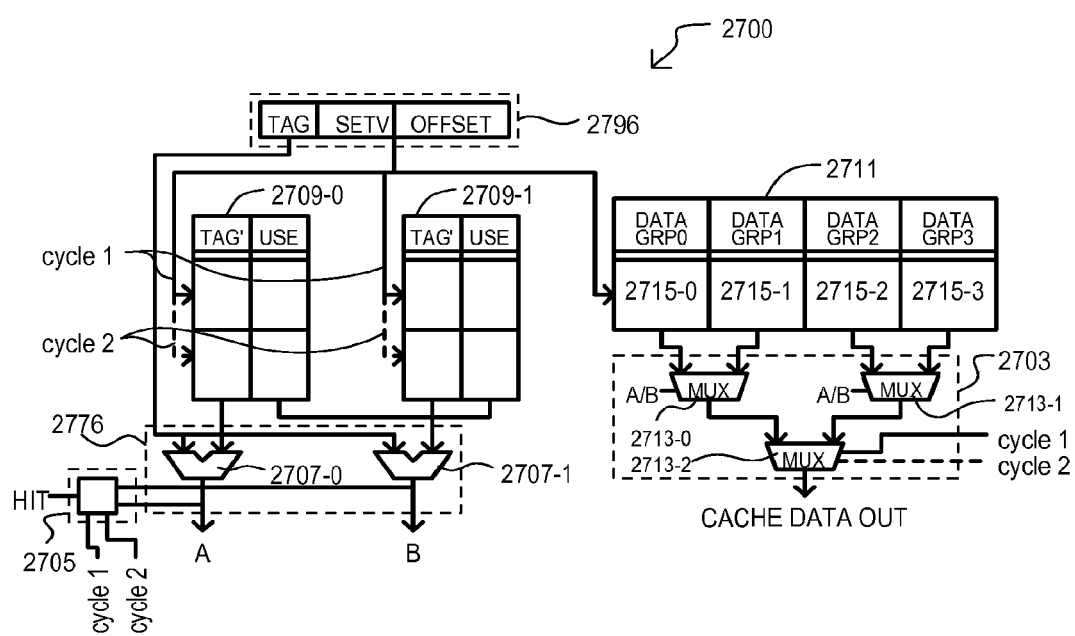
FIG. 27 is a block schematic diagram of another cache memory architecture that may be included in the embodiments.

Referring now to FIG. 27, another particular example of a cache architecture that may be included in embodiments is shown in a block schematic diagram and designated by the general reference character 2700. Cache architecture 2700 may include similar sections to those of FIG. 26, according like sections are referred to by the same reference character but with the first two digits being "27" instead of "26".

Cache architecture 2700 may provide for configurable associativity. That is, a set value may be configurable for a different granularity in cache compare tries. A cache input 2796 may receive values TAG, SETV and OFFSET. As in the case of FIG. 26, such values may have a bit wise correspondence with a received address value, or may be generated from a received address values. However, values SETV and OFFSET are understood to be variable. In one embodiment, as a value SETV is increased, a value OFFSET is correspondingly decreased.

In the particular embodiment of FIG. 27, cached data and tag data may be separate from one another. Cache architecture may include tag blocks 2709-0 and 2709-1 and data block 2711. Tag blocks (2709-0 and 2709-1) may include a number of entries accessible by values SETV and OFFSET, and according to a particular access cycle. Each such entry may include a cached tag value TAG' and a USE value, like those described for FIG. 26. However, such entries do not store a cached data value. As represented by solid and dashed lines "cycle 1" and "cycle 2", on one clock cycle (cycle 1), a first portion of entries in tag blocks (2709-0 and 2709-1) may be accessed to output a cached tag value TAG'. On a next clock cycle (cycle 2), a next portion of tag blocks (2709-0 and 2709-1) may be accessed to output another cached tag value TAG'. In a particular embodiment, an input tag value TAG and cached tag values TAG' may be portions of a larger tag value. Accordingly, a valid cache hit may result when hits occur over multiple cycles.

A data block 2711 may include a number of entries accessible by values SET and OFFSET. A data block 2711 may be organized into groups corresponding to both tag blocks and access cycles. In the particular example of FIG. 27, data block 2711 may include group 2715-0, which may correspond to tag block 2909-0 and cycle 1, group 2715-1, which may correspond to tag block 2909-1 and cycle 1, group 2715-2, which may correspond to tag block 2909-0 and cycle 2, and group 2715-3, which may correspond to tag block 2909-1 and cycle 2.

A cache compare circuit 2776 may compare cached tag values TAG' to input value TAG to thereby determine if a cache hit has occurred in any tag block (2709-0 to 2709-1). In the very particular example of FIG. 27, compare section 2776 may include comparators 2707-0 and 2707-1, which may each compare an input tag value TAG to a cached tag value TAG1 output from tag blocks 2798-0 to 2798-3 on a given cycle, to thereby generate a block hit indications A and B.

A cache data output control 2703 may output cached data DATA corresponding to a hit within a given tag block (2707-0 to 2707-1) and a given operational cycle. In the very particular embodiment of FIG. 27, a cache data output control 2703 may include data block MUXs 2713-0 and 2713-1 and cycle MUX 2713-2. Data block MUX 2713-0 may output a data value from either group 2715-0 or group 2715-1 in response to hit indications A and B. Data block MUX 2713-1 may output a data value from either group 2715-2 or group 2715-3 in response to hit indications A and B. Cycle MUX 2713-2 may output values from data block MUX 2713-0 or 2713-1 in response to signals cycle 1 and cycle 2.

Cache hit logic 2705 may provide a HIT indication by logically combining block hit indications A and B according to clock cycles (cycle 1 and cycle 2).

In this way, memory devices may include cache architectures with configurable associativity.

Figure 28:
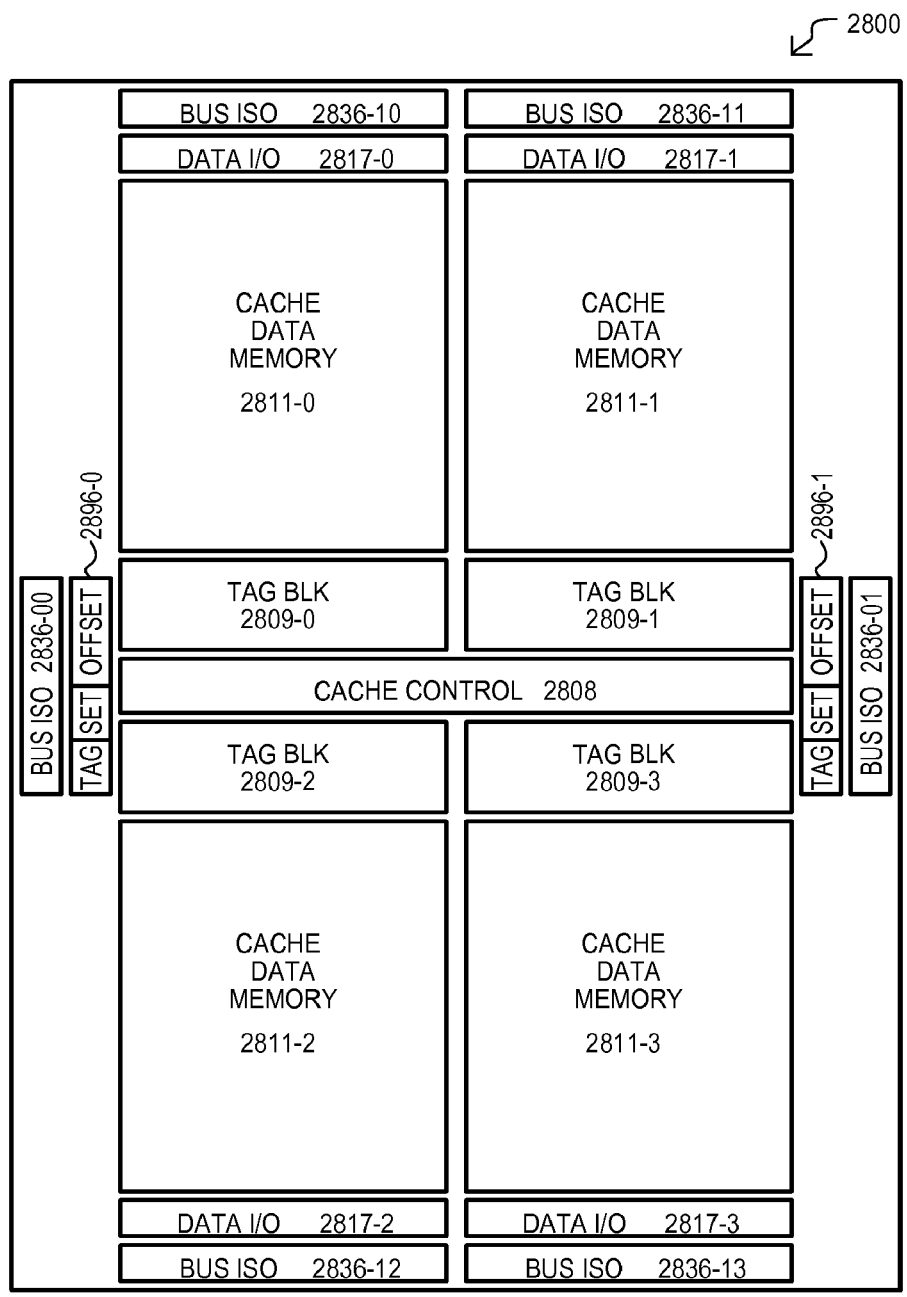
FIG. 28 is a top plan view of a module cache device according to an embodiment.

Referring now to FIG. 28, a memory device according another embodiment is shown in a top plan view, and designated by the general reference character 2800. A memory device 2800 may be a single integrated circuit formed in a common substrate. A memory device 2800 may include cache data memory sections 2811-0 to 2811-3, tag blocks 2809-0 to 2809-3, cache controller 2808, control inputs 2896-0 and 2896-1, bus isolation circuit 2836-00 to 2836-13, and data input/outputs (I/Os) 2817-0 to 2817-3. A memory device 2800 may be mounted on a circuit board with other memory circuits in integrated circuit (IC) form (referred to herein as module storage ICs).

Cache data memory sections 2811-0 to 2811-3 may include storage locations for data cached for module storage ICs. In very specific embodiments, data memory sections 2811-0 to 2811-3 may include all or a portion of: cache memory 106, 406, 506, 606 of FIGS. 1, 4, 5, 6; module storage locations that store data values Dy[0:71], Dz[0:71], cached data 1262 of FIG. 12, cache data store 2580 FIG. 25, data portions of tag/data blocks 2698-0 to 2698-3, and/or data blocks 2711 of FIG. 27. Cache data memory sections (2811-0 to 2811-3) may be formed with an architecture having a faster access time than module storage ICs. Cache data memory sections (2811-0 to 2811-3) may include random access memory (RAM) circuits. In a particular embodiment, cache data memory sections (2811-0 to 2811-3) may include static RAM (SRAM) memory cells and module storage ICs may be dynamic RAMs (DRAMs). In another embodiment, cache data memory sections (2811-0 to 2811-3) may be SRAMs or DRAMs, and module storage ICs may be nonvolatile memory ICs, including but not limited to electrically erasable and programmable read only memories (EEPROMs), such as "flash" EEPROMs.

Tag blocks 2809-0 to 2809-3 may provided data values for compare operations with address values to determine if a cache hit or cache miss has occurred. In particular embodiments, tag blocks (2809-0 to 2809-3) may form all or a portion of: cache memory 106, 406, 506, 606 of FIGS. 1, 4, 5, 6; locations that store cache compare address values ADDy, ADDz in FIGS. 8A to 10, cache indices 1260-0 to 1260-2 of FIG. 12, cache indices 2578 FIG. 25, tag portions of tag/data blocks 2698-0 to 2698-3, and/or tag blocks 2709-0 and 2709-1 of FIG. 27.

Cache controller 2808 may include circuitry for controlling functions on memory device 2800 as described for embodiments herein and equivalents. In particular embodiments, cache controller 2808 may form all or a portion of any of: cache controller 108 or 608 of FIG. 1 or 6, cache controller and/or cache controller I/F 408/434, 508/534, 1208/1234 of FIGS. 4, 5 and 12, controller circuit 2572, or cache compare circuits 2576, 2676, or 2776, or cache hit logic 2605 or 2705 of FIGS. 25, 26 and 27.

Control inputs 2896-0 to 2896-3 may receive address and control signals from bus isolation circuit 2836-0 to 2836-3 and provide such values to cache controller 2808. In particular embodiments, control inputs (2896-0 to 2896-3) may form all or a portion of controller inputs 2696 or 2796 of FIGS. 26 and 27.

Data input/outputs (I/O) 2817-0 to 2817-3 may provide read data paths from and write data paths into cached data memory sections 2811-0 to 2811-3. In particular embodiments, data I/Os (2817-0 to 2817-3) may include all or a portion of: cache data output controls 2603 or 2703 of FIGS. 26 and 27.

Bus isolation circuits 2836-00 to 2836-13 may be allow signals to flow into and out of memory device 2800, and in particular embodiments (e.g., look aside architectures) may allow such signals to flow through memory device 2800. In one embodiment, bus isolation circuits 2836-00 and 2836-01 may carry address and control signals into and/or through memory device 2800, while bus isolation circuits 2836-10 to 2836-13 may provide data I/O paths. In very particular embodiments, bus isolation circuits (2836-00 to 2836-13) may include all or a portion of: bus isolation circuits 436, 536 of FIGS. 4 and 5, isolation buffer circuits 538, 540-0/1, 838, 840-0/1, 938, 940-0/1, 1038-0/1, 1040-00/01/10/11 of FIGS. 5, 8, 9, 10 and other embodiments, or bus control section 2574 of FIG. 25.

In this way, a memory device may be module cache IC having a centrally located cache controller, data I/Os on first opposing ends, and control and address inputs at second opposing ends.

Figure 29:
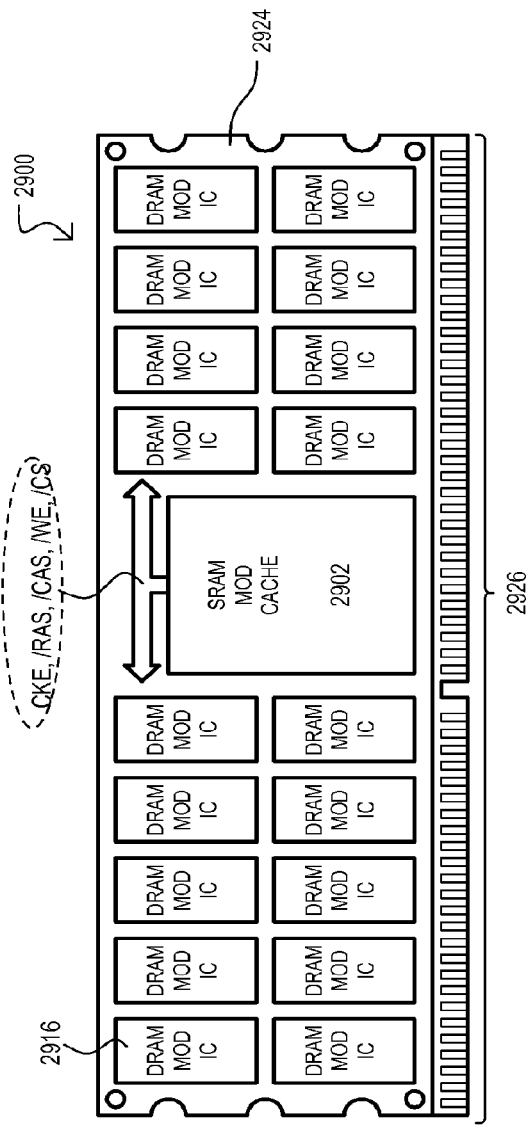
FIG. 29 is a plan view of a dual in-line memory module (DIMM) memory device according to an embodiment.

Referring now to FIG. 29, a memory device according to one very particular embodiment is shown in a plan view and designated by the general reference character 2900. A memory device 2900 may be an in-line memory module, more particularly, a dual in-line memory module (DIMM) having DRAM memory circuits (one shown as 2916) and a corresponding module cache device 2902 formed on one or more sides of a circuit board 2924.

DRAM memory circuits (e.g., 2916) may be DRAMs in integrated circuit form for providing memory for a system, or the like. Module cache device 2902 may take the form of module cache device shown herein and equivalents. In the very particular embodiment of FIG. 29, a module cache device 2902 may have storage circuits based on SRAM memory cells. Further, module cache device 2902 may output particular DRAM control signals, including but not limited to: row address strobe /RAS, column address strobe /CAS, write enable /WE, chip select /CS, and clock enable CKE.

A DIMM circuit board 2924 may include circuit board connections 2926 for receiving input signals and providing output signals to a system. In the particular embodiment shown, circuit board connections 2926 may exist on opposing sides of circuit board 2924.

Control signals /RAS, /CAS, /WE, /CS, and CKE may be applied by module cache device 2902 to DRAM memory circuits (e.g., 2916). By application of such signals, a module cache device 2902 may enable various operations described for other embodiments herein. In particular, such signals may be driven by module cache device 2902 to: pre-fetch data from DRAM memory circuits (e.g., 2916) by forming a read command to access a pre-fetch location; write back cached data into DRAM memory circuits (e.g., 2916) by forming a write command to access a write location; command such DRAM memory circuits (e.g., 2916) to enter a power down state, stay within a power down state, and exit a power down state; and activate DRAM memory circuits (e.g., 2916), for example by issuing a precharge command and then a bank address (on an address but line not shown) which opens the bank.

In this way, a memory device may include a DIMM having DRAM memory circuits and a module cache device.

Figure 30:
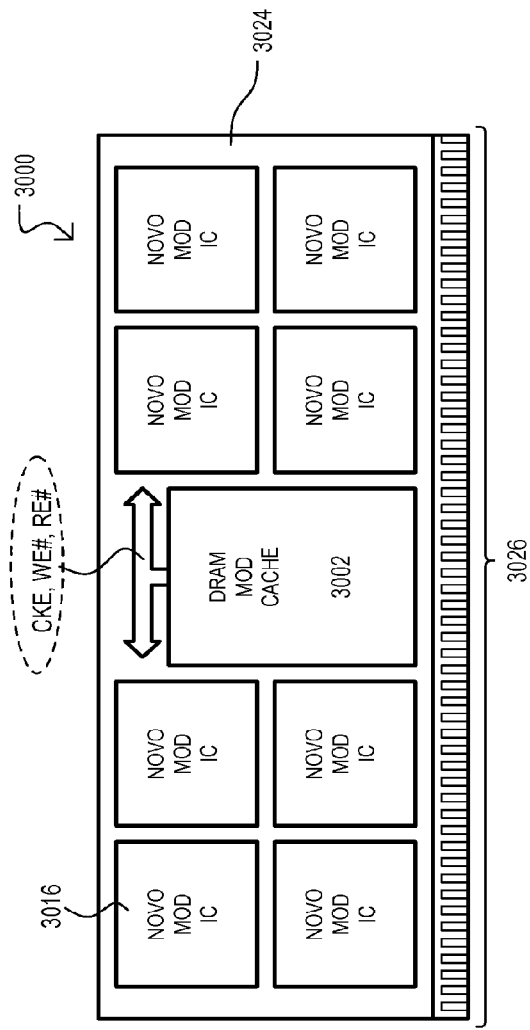
FIG. 30 is a plan view of a nonvolatile storage module memory device according to an embodiment.

Referring now to FIG. 30, a memory device according to another particular embodiment is shown in a plan view and designated by the general reference character 3000. A memory device 3000 may be a nonvolatile memory module. Memory device 3000 may have a number of nonvolatile memory circuits (one shown as 3016) and a corresponding module cache device 3002 formed one or more sides of a circuit board 3024.

Nonvolatile memory circuits (e.g., 3016) may retain data values even in the absence of power. In one very particular embodiment, nonvolatile memory circuits (e.g., 3016) may include "flash" EEPROMs, and module cache device 3902 may include DRAM based cache storage locations. Module cache device 3002 may take the form of module cache device shown herein and equivalents. In the very particular embodiment of FIG. 30, a module cache device 3002 may output EEPROM control signals including but not limited to: read enable RE#, write enable # and clock enable CKE.

Like the embodiment of FIG. 29, a circuit board 3024 may include circuit board connections 3026 for receiving input signals and providing output signals to a system. Control signals RE#, WE# and CKE may be applied by module cache device 3002 to nonvolatile memory circuits (e.g., 3016). By application of such signals, a module cache device 3002 may enable the various operations noted for FIG. 29. However, write operations may be program operations. Further, such operations may include erase operations.

In this way, a memory device may include a memory module having nonvolatile memory circuits and a module cache device.

Various embodiments shown above, including those of FIGS. 14 to 17B, have shown devices and methods with variable latency responses arising from cache hits having different access times than cache misses. Such embodiments have shown "in sequence" processing of commands where commands are processed by a module cache device in the order in which they are received. However, in other embodiments, commands may be processed "out of sequence". Examples of out of sequence processing embodiments will now be described with reference to FIGS. 31A and 31B.

Figure 31A:
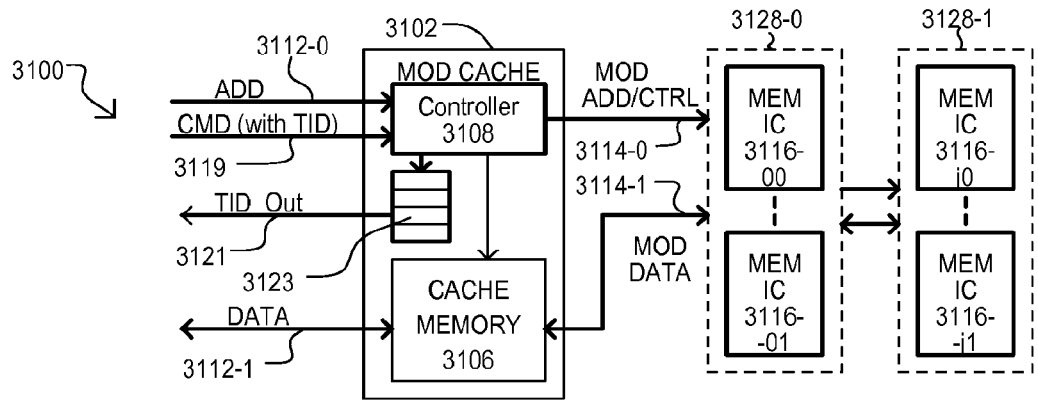
FIGS. 31A and 31B show a block schematic diagram and timing diagram of a memory device according to another embodiment.

Referring to FIG. 31A, a memory device is shown in block schematic diagram, and designated by the general reference character 3100. A memory device 3100 may include some items like those shown in FIG. 1, accordingly like items are referred to by the same reference character but with the leading digits being "31" instead of "1".

Unlike FIG. 1, in FIG. 31A a module cache device 3102 may include a controller 3108, a transaction identifier (TID) register 3123, and a TID output 3121. In addition, controller 3108 may receive command data on controller command connections 3119 that includes both command data as well as a TID value.

A controller 3108 may store TID values received on command connections 3119, store such values in TID register 3123, and then output such values on TID output 3121 with corresponding data on data connections 3112-1. More particularly, in response to a cache hit, a controller 3108 may access cache memory 3106 to service a command before a previous command having a cache miss.

Having described various sections of a memory device that may accomplish out of sequence command processing, particular operations of such a device will now be described.

Figure 31B:
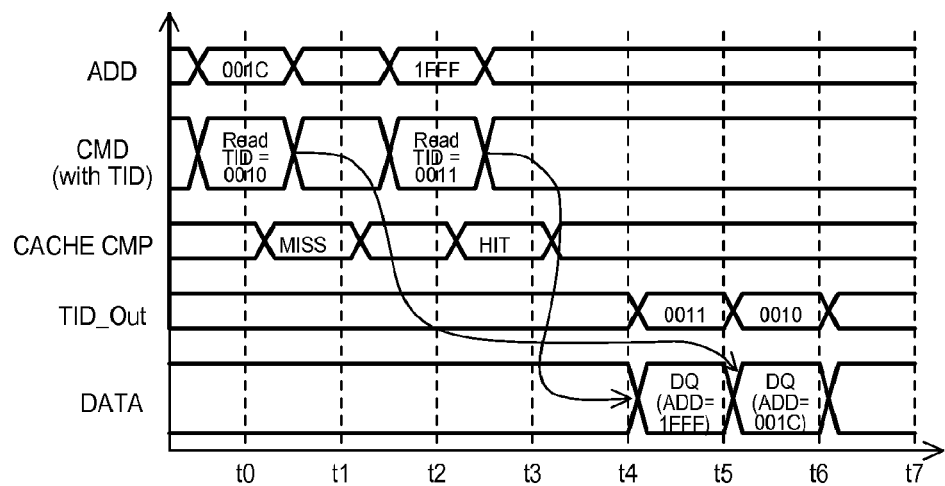

Referring to FIG. 31B a timing diagram shows an out of sequence processing operation.

At about time t0, a module cache device (e.g., 3102) may receive a read command with a TID=0010 for address "001C". The TID value (0010) may be stored in TID register 3123. As shown by waveform CACHE CMP, such an access results in a cache miss (MISS). In response to the cache miss, a module cache device (e.g., 3102) may start to access in line memory modules (e.g., 3128-0 and/or 3128-1). TID value (0010) may remain stored in TID register 3123.

At about time t2, a module cache device (e.g., 3102) may receive a read command with a TID=0011 for address "1FFF". As shown by waveform CACHE CMP, such an access results in a cache hit (HIT). The TID value (0010) may be stored in TID register 3123. In response to the cache hit, a module cache device (e.g., 3102) may access cache memory 3108. TID values (0010 and 0011) may remain stored in TID register 3123. In addition, in line memory modules (3128-0 and/or 3128-1) may continue to be accessed in response to the read command received at time t0.

At about time t4, an access to cache memory 3106 for data corresponding to address 1FFF may be complete. Controller 3108 may output cached read data DQ(ADD=1FFF) along with the corresponding TID=0011. TID value (0010) from the previous command may remain stored in TID register 3123, and in line memory modules (3128-0 and/or 3128-1) may continue to be accessed in response to the previous read command (at time t0).

At about time t5, an access to in line memory modules (3128-0 and/or 3128-1) for data corresponding to address 001C may be complete. Controller 3108' may output such read data DQ(ADD=001C) along with the corresponding TID=0010.

In this way, a module cache device may service commands out of sequence and provide a transaction identifier with output data.

Figure 32:
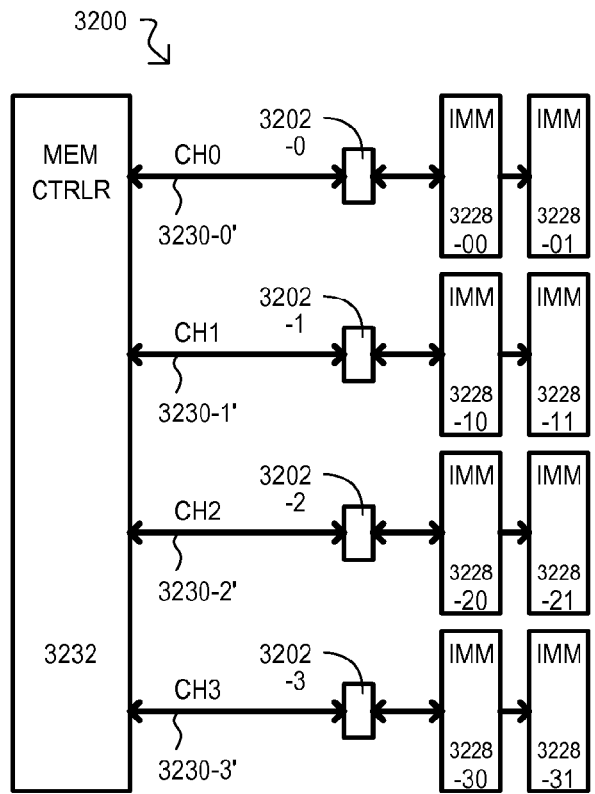
FIG. 32 is a block schematic diagram of a memory device according to a further embodiment.

Referring to FIG. 32, a memory device 3200 according to another embodiment is shown in a block schematic diagram. In one particular embodiment, a memory device 3200 may be one implementation of embodiments shown in FIGS. 1 and/or 2. A memory device 3200 may include a number of in-line memory modules (IMMs) 3228-00 to 3228-31, module cache devices 3202-0 to 3202-3, and a memory controller 3232.

Unlike some other embodiments, a module cache device (3202-0 to 3202-3) may not be physically attached to IMMs (3228-00 to 3228-31). Instead, module cache devices 3202-0 to 3202-3 may be formed between such IMMs (3228-00 to 3228-31) and memory controller 3232. As but two very particular examples, module cache devices (3202-0 to 3202-3) may be formed on a larger circuit board (e.g., motherboard) as separate integrated circuits attached to such a board, or as components on a circuit board insertable into the larger circuit board that is different from the IMMs (3228-00 to 3228-31).

Referring still to FIG. 32, each module cache device (3202-0 to 3202-3) may communicate with memory controller 3232 along controller channels (3230-0' to 3230-32'). In some embodiments, controller channels (3230-0' to 3230-32') may be buses with multiple bits values transmitted in parallel. However, in other embodiments, controller channels (3230-0' to 3230-32') may include one or more serial buses with bit values transmitted in a serial fashion.

A memory controller 3232 may generate control and address values for transmission on controller channels (3230-0' to 3230-3') to access storage locations within IMMs (3228-00 to 3228-31). A memory controller 3232 may also receive read data and/or output write data on controller channels (3230-0' to 3230-3'). In the event a data location is a cached location, an access may be faster than an arrangement that does not include module cache devices (3202-00 to 3202-31). A memory controller 3232 may be one or more separate ICs, or may be a portion of a larger IC package, such as those that include one or more microprocessors.

In this way, a memory device may include a memory controller that accesses multiple IMMs on multiple controller channels, where module cache devices are situated between the controller and the IMMs.

Figure 33:
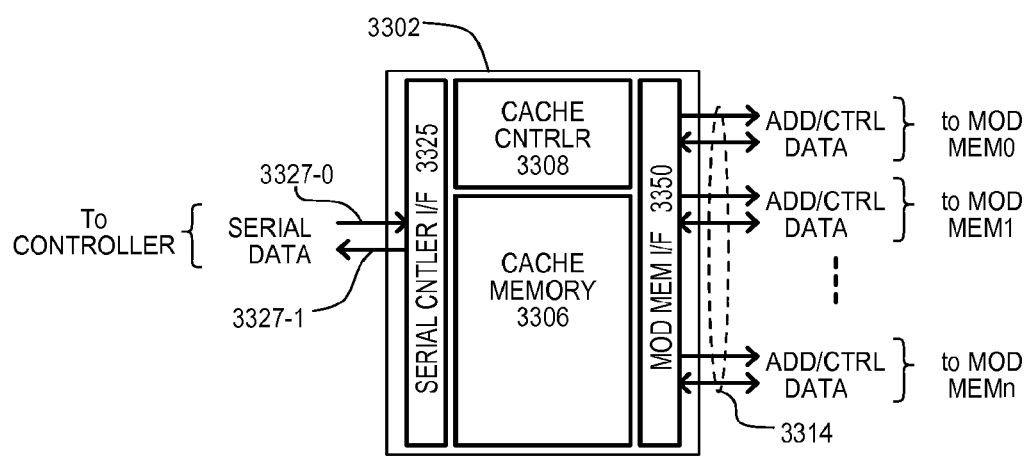
FIG. 33 is a block schematic diagram of another module cache device according to an embodiment.

Referring to FIG. 33, a module cache device according to another embodiment is shown in block schematic diagram and designated by the general reference character 3302. A module cache device 3302 may include some sections like those shown in FIG. 6, accordingly, like sections are referred to by the same reference characters but with leading digits being "33" instead of "6".

A module cache device 3302 may include a serial controller interface 3325 for communicating with a memory controller by one or more serial data paths 3327-0/1.

In this way, a module cache memory device may have a serial interface for communicating with a memory controller.

Embodiments of the present invention are well suited to performing various other steps or variations of the steps recited herein, and in a sequence other than that depicted and/or described herein. In one embodiment, such a process is carried out by processors and other electrical and electronic components, e.g., executing computer readable and computer executable instructions comprising code contained in a computer usable medium.

For purposes of clarity, many of the details of the embodiments of impedance programming of the output driver and on-die termination and the methods of designing and manufacturing the same that are widely known and are not relevant to the present invention have been omitted from the following description.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claims require more features than are expressly recited in each claim. Rather, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. A memory apparatus, comprising:
   a memory controller;
   a plurality of channel buses coupled to the memory controller, each channel bus configured to receive a plurality of in line memory modules; and
   at least one cached in-line memory module (IMM) coupled to one of the channel buses, the cached IMM including
      a substrate comprising connections for interfacing with the one of the channel buses,
      a plurality of dynamic random access memory (DRAM) circuits mounted on the substrate, the DRAM circuits configured to store data at one or more memory addresses, and
      a module cache device mounted on the substrate configured to cache the data for the DRAM circuits by storing the data that is stored by the DRAM circuits, the module cache device configured to output the data stored by the module cache device in response to receiving an access request corresponding to the one or more memory addresses, without accessing the DRAM circuits in response to the access request.

2. The memory apparatus of claim 1, wherein:
   the at least one cached IMM is a dual in-line memory module (DIMM).

3. The memory apparatus of claim 1, wherein:
   the module cache device comprises cache memory formed from static random access memory (SRAM) cells.

4. The memory apparatus of claim 1, wherein:
   the module cache device outputs DRAM device control signals to the DRAM devices.

5. The memory apparatus of claim 1, wherein:
the at least one cached IMM comprises a plurality of cached IMMs, each coupled to one of the channel buses, to provided caching of data for all DRAM circuits of the memory apparatus.

6. The memory apparatus of claim 1, wherein:
the memory controller is configured to transfer data words of size N; and
each channel bus is configured to transfer data word portions of size M, where M is a fraction of N; wherein
data words of size N are striped across multiple channel buses.

7. The memory apparatus of claim 1, wherein:
the substrate comprises a circuit board.

8. A memory apparatus, comprising:
an in-line memory module substrate including a plurality of memory bus connections;
a plurality of memory devices with memory cells of a first type mounted to the substrate to store data; and
a module cache device mounted to the substrate and coupled to the memory devices and configured to cache data values stored by the memory devices with storage circuits formed with memory cells of a second type, the module cache device configured to provide the data values from the storage circuits responsive to an access request corresponding to an address of the plurality of memory devices, without accessing the storage circuits responsive to the access request.

9. The memory apparatus of claim 8, wherein:
the memory cells of the first type are dynamic random access memory (DRAM) cells.

10. The memory apparatus of claim 9, wherein:
the memory cells of the second type are static random access memory (SRAM) cells.

11. The memory apparatus of claim 8, wherein:
the memory cells of the first type are nonvolatile storage memory cells.

12. The memory apparatus of claim 8, wherein:
the module cache device outputs memory device control signals to the memory devices to access data therefrom.

13. The memory apparatus of claim 8, wherein:
the in-line memory module is a dual in-line memory module (DIMM) circuit board;
the plurality of memory devices comprise dynamic random access memory (DRAM) devices; and
the module cache device comprises static RAM (DRAM) storage to cache data values stored by the DRAM devices.

14. A method, comprising:
in a system comprising a memory controller coupled to a plurality of memory buses through a plurality of bi-directional channel busses,
using at least one cached in-line memory module (IMM) connected to one of the memory buses to provide data of first storage locations to the memory controller over the memory bus,
caching the data of the first storage locations with a module cache device on the cached IMM; and
using the cached data to service an access request, associated with an address of the first storage locations, received from the memory controller.

15. The method of claim 14, further comprising:
connecting one or more further cached IMMs to one or more of the plurality of memory buses to provide access by the memory controller to further storage locations, and
caching the data storage locations of each of the one or more further cached IMM with a module cache device on each corresponding one or more further cached IMMs.

16. The method of claim 15, further including:
accessing data words of size N stored in the cached IMMs over the memory buses.

17. The method of claim 15, further including:
accessing data words of size N, where a portion of the data word is accessed over each channel.

18. The method of claim 14, wherein:
using the at least one cached IMM to one of the memory buses includes using a cached dual IMM (DIMM) to a memory bus.

19. The method of claim 14, wherein:
using the at least one cached IMM to one of the memory buses includes using a cached IMM having storage locations formed by dynamic random access memory (DRAM) cells.

20. The method of claim 14, wherein:
caching the data of the first storage locations with the module cache device includes caching the data of the first storage locations with static random access memory (SRAM) cells.

* * * * *